US012676199B2

(12) United States Patent
Lee et al.

(10) Patent No.: US 12,676,199 B2
(45) Date of Patent: Jul. 7, 2026

(54) MEMORY DEVICE PERFORMING LEAKAGE DETECTION OPERATION

(71) Applicant: SAMSUNG ELECTRONICS CO., LTD., Suwon-si (KR)

(72) Inventors: Hyunee Lee, Suwon-si (KR); Wandong Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 207 days.

(21) Appl. No.: 18/425,450

(22) Filed: Jan. 29, 2024

(65) Prior Publication Data

US 2024/0274209 A1      Aug. 15, 2024

(30) Foreign Application Priority Data

Feb. 13, 2023      (KR) ......................... 10-2023-0018864

(51) Int. Cl.
*G11C 16/34*          (2006.01)
*G11C 16/04*          (2006.01)
(Continued)

(52) U.S. Cl.
CPC ...... *G11C 16/3431* (2013.01); *G11C 16/0433* (2013.01); *G11C 16/08* (2013.01); *G11C 29/04* (2013.01); *G11C 29/12* (2013.01); *G11C 29/50* (2013.01); *G11C 2029/1202* (2013.01); *G11C 2029/5006* (2013.01)

(58) Field of Classification Search
CPC . G11C 16/3431; G11C 16/0433; G11C 16/08;

G11C 29/04; G11C 29/12; G11C 29/50;
G11C 2029/1202; G11C 2029/5006;
G11C 29/025; G11C 16/0483; G11C
29/12005

See application file for complete search history.

(56) References Cited

U.S. PATENT DOCUMENTS 8,159,883 B2      4/2012   Baek et al.
9,514,835 B2    12/2016   Magia et al.
(Continued)

FOREIGN PATENT DOCUMENTS

KR       10-2023-0085792 A       6/2023

OTHER PUBLICATIONS

Communication issued Jul. 15, 2024 by the European Patent Office in the European Patent Application No. 24156619.9.

*Primary Examiner* — Donald H B Braswell
(74) *Attorney, Agent, or Firm* — Sughrue Mion, PLLC

(57) ABSTRACT

In some embodiments, the memory device includes a memory cell array including a plurality of memory blocks including a plurality of word lines, a pass transistor circuit including a plurality of pass transistors coupled to the plurality of word lines, a row decoder configured to provide a block selection voltage to first terminals and a driving voltage to second terminals of the plurality of pass transistors, a voltage generator configured to generate the block selection voltage and the driving voltage, and a control circuit configured to control the row decoder and the voltage generator, perform a leakage detection operation on a target memory block of the plurality of memory blocks, set a plurality of first detection word lines of the target memory block to a first voltage level, and set a plurality of second detection word lines of the target memory block to a second voltage level.

17 Claims, 12 Drawing Sheets

(51) Int. Cl.
　　G11C 16/08　　　　(2006.01)
　　G11C 29/04　　　　(2006.01)
　　G11C 29/12　　　　(2006.01)
　　G11C 29/50　　　　(2006.01)

(56)　　　　　　　　References Cited

U.S. PATENT DOCUMENTS

|  |  |  |  |
|---|---|---|---|
| 9,842,659 B2 | 12/2017 | Nam et al. | |
| 10,008,276 B2 | 6/2018 | Huynh et al. | |
| 10,249,546 B2 | 4/2019 | Measor et al. | |
| 2009/0063918 A1 | 3/2009 | Chen et al. | |
| 2012/0008384 A1 | 1/2012 | Li et al. | |
| 2012/0008410 A1 | 1/2012 | Huynh et al. | |
| 2014/0247658 A1 | 9/2014 | Hosono | |
| 2017/0278578 A1* | 9/2017 | Nagai | G11C 16/0433 |
| 2017/0316834 A1* | 11/2017 | Huynh | G11C 16/3422 |
| 2019/0006021 A1 | 1/2019 | Ghai et al. | |
| 2019/0146040 A1 | 5/2019 | Murakami et al. | |
| 2020/0105345 A1 | 4/2020 | Baek et al. | |
| 2020/0105347 A1* | 4/2020 | Nam | G11C 11/5635 |
| 2022/0044758 A1 | 2/2022 | Son et al. | |
| 2022/0093206 A1 | 3/2022 | Joo et al. | |
| 2022/0101930 A1 | 3/2022 | Choi et al. | |

* cited by examiner

FIG. 2

MEMORY DEVICE PERFORMING LEAKAGE DETECTION OPERATION

CROSS-REFERENCE TO RELATED APPLICATIONS

This application claims benefit of priority under 35 U.S.C. § 119 to Korean Patent Application No. 10-2023-0018864, filed on Feb. 13, 2023, in the Korean Intellectual Property Office, the disclosure of which is incorporated by reference herein in its entirety.

BACKGROUND

The present disclosure relates generally to memory devices, and more particularly, to memory devices performing leakage detection operations.

Memory devices may be classified into volatile memory devices and non-volatile memory devices according to whether stored data may be lost when power supplied to the memory device is interrupted. For example, non-volatile memory devices may include, but not be limited to, electrically erasable and programmable flash memory devices.

A non-volatile memory device may include a memory cell array including a plurality of memory blocks. Each memory block of the plurality of memory blocks may include a plurality of word lines. Leakage in the non-volatile memory device may occur in the plurality of word lines and may be caused by deterioration of the non-volatile memory device, for example. Such leakage may cause a malfunction of the non-volatile memory device. Therefore, there is a need for a method capable of detecting leakage that may occur in a non-volatile memory device.

SUMMARY

Aspects of the present disclosure provide for a memory device capable of detecting leakage occurring in a plurality of word lines.

According to an aspect of the present disclosure, a memory device is provided. The memory device includes a memory cell array including a plurality of memory blocks. The plurality of memory blocks includes a plurality of word lines. The memory device further includes a pass transistor circuit including a plurality of pass transistors coupled to the plurality of word lines. The memory device further includes a row decoder configured to provide a block selection voltage to first terminals of the plurality of pass transistors and provide a driving voltage to second terminals of the plurality of pass transistors. The memory device further includes a voltage generator configured to generate the block selection voltage and the driving voltage. The memory device further includes a control circuit configured to control the row decoder and the voltage generator and perform a leakage detection operation on the plurality of memory blocks. The control circuit is further configured, when the leakage detection operation is performed on a target memory block from among the plurality of memory blocks, to set a plurality of first detection word lines from among the plurality of word lines of the target memory block to a first voltage level by applying the driving voltage to a first plurality of second terminals of the plurality of pass transistors coupled to the plurality of first detection word lines of the target memory block, and set a plurality of second detection word lines from among the plurality of word lines of the target memory block to a second voltage level by applying the driving voltage to a second plurality of second terminals of the plurality of pass transistors coupled to the plurality of second detection word lines of the target memory block, the second voltage level being lower than the first voltage level.

According to an aspect of the present disclosure, a memory device is provided. The memory device includes a memory cell array including a plurality of memory blocks. The plurality of memory blocks includes a plurality of word lines, one or more string select lines, and one or more ground select lines. The memory device further includes a pass transistor circuit including a plurality of pass transistors coupled to the plurality of memory blocks through the plurality of word lines, the one or more string select lines, and the one or more ground select lines. The memory device further includes a row decoder configured to provide a block selection voltage to first terminals of the plurality of pass transistors and provide a driving voltage to second terminals of the plurality of pass transistors. The memory device further includes a voltage generator configured to generate the block selection voltage and the driving voltage. The memory device further includes a control circuit configured to control the row decoder and the voltage generator and perform a leakage detection operation on the plurality of memory blocks. The control circuit is further configured, when the leakage detection operation is performed on a target memory block from among the plurality of memory blocks, to set, in a first operation of the leakage detection operation, the one or more string select lines and the one or more ground select lines to a cut-off voltage level by applying the driving voltage to a first plurality of second terminals of the plurality of pass transistors coupled to the one or more string select lines and the one or more ground select lines of the target memory block.

According to an aspect of the present disclosure, a memory device is provided. The memory device includes a memory cell array including a plurality of memory blocks. The plurality of memory blocks including a plurality of word lines, one or more string select lines, and one or more ground select lines. The memory device further includes a pass transistor circuit including a plurality of pass transistors coupled to the plurality of memory blocks through the plurality of word lines, the one or more string select lines, and the one or more ground select lines. The memory device further includes a row decoder configured to provide a block selection voltage to first terminals of the plurality of pass transistors and provide a driving voltage to second terminals of the plurality of pass transistors. The memory device further includes a voltage generator configured to generate the block selection voltage and the driving voltage. The memory device further includes a control circuit configured to control the row decoder and the voltage generator and perform a leakage detection operation on the plurality of memory blocks. The control circuit is further configured, when the leakage detection operation is performed on a target memory block from among the plurality of memory blocks, to set a plurality of first detection word lines from among the plurality of word lines of the target memory block to a first voltage level by applying the driving voltage to a first plurality of second terminals of the plurality of pass transistors coupled to the plurality of first detection word lines of the target memory block, set a plurality of second detection word lines from among the plurality of word lines of the target memory block to a second voltage level by applying the driving voltage to a second plurality of second terminals of the plurality of pass transistors coupled to the plurality of second detection word lines of the target memory block, and set the one or more string select lines and the one or more ground select lines to a third voltage level by applying the driving voltage to a third plurality of second terminals of the plurality of pass transistors coupled to the one or more string select lines and the one or more ground select lines of the target memory block. The second voltage level is lower than the first voltage level.

Additional aspects may be set forth in part in the description which follows and, in part, may be apparent from the description, and/or may be learned by practice of the presented embodiments.

BRIEF DESCRIPTION OF DRAWINGS

The above and other aspects, features, and advantages of certain embodiments of the present disclosure may be more apparent from the following description taken in conjunction with the accompanying drawings, in which:

FIG. 2 is a block diagram of a memory device, according to an embodiment;

DETAILED DESCRIPTION

Figure 1:
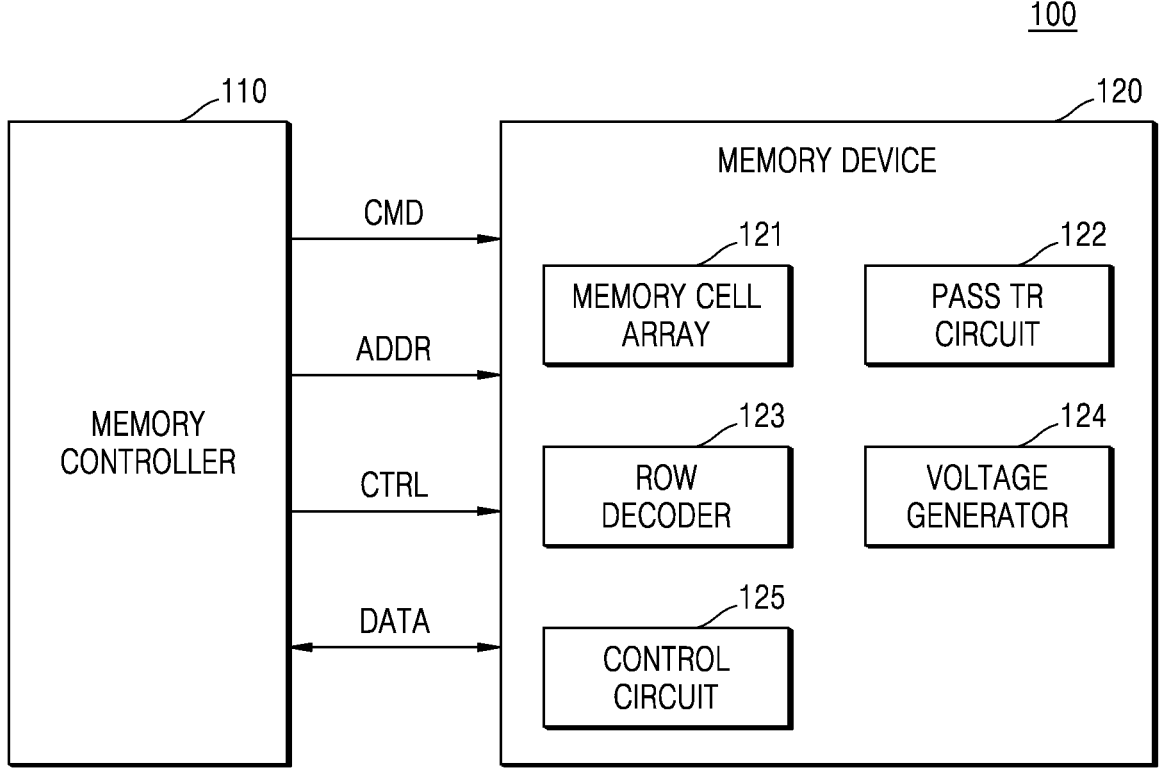
FIG. 1 is a block diagram of a memory system, according to an embodiment.

The following description with reference to the accompanying drawings is provided to assist in a comprehensive understanding of embodiments of the present disclosure defined by the claims and their equivalents. Various specific details are included to assist in understanding, but these details are considered to be exemplary only. Therefore, those of ordinary skill in the art may recognize that various changes and modifications of the embodiments described herein may be made without departing from the scope and spirit of the disclosure. In addition, descriptions of well-known functions and structures are omitted for clarity and conciseness.

With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wired), wirelessly, or via a third element.

It is to be understood that when an element or layer is referred to as being "over," "above," "on," "below," "under," "beneath," "connected to" or "coupled to" another element or layer, it may be directly over, above, on, below, under, beneath, connected or coupled to the other element or layer or intervening elements or layers may be present. In contrast, when an element is referred to as being "directly over," "directly above," "directly on," "directly below," "directly under," "directly beneath," "directly connected to" or "directly coupled to" another element or layer, there are no intervening elements or layers present.

The terms "upper," "middle", "lower", and the like may be replaced with terms, such as "first," "second," third" to be used to describe relative positions of elements. The terms "first," "second," third" may be used to described various elements but the elements are not limited by the terms and a "first element" may be referred to as a "second element". Alternatively or additionally, the terms "first", "second", "third", and the like may be used to distinguish components from each other and do not limit the present disclosure. For example, the terms "first", "second", "third", and the like may not necessarily involve an order or a numerical meaning of any form.

Reference throughout the present disclosure to "one embodiment," "an embodiment," "an example embodiment," or similar language may indicate that a particular feature, structure, or characteristic described in connection with the indicated embodiment is included in at least one embodiment of the present solution. Thus, the phrases "in one embodiment", "in an embodiment," "in an example embodiment," and similar language throughout this disclosure may, but do not necessarily, all refer to the same embodiment.

It is to be understood that the specific order or hierarchy of blocks in the processes/flowcharts disclosed are an illustration of exemplary approaches. Based upon design preferences, it is understood that the specific order or hierarchy of blocks in the processes/flowcharts may be rearranged. Further, some blocks may be combined or omitted. The accompanying claims present elements of the various blocks in a sample order, and are not meant to be limited to the specific order or hierarchy presented.

The embodiments herein may be described and illustrated in terms of blocks, as shown in the drawings, which carry out a described function or functions. These blocks, which may be referred to herein as units or modules or the like, or by names such as device, logic, circuit, counter, comparator, generator, converter, or the like, may be physically implemented by analog and/or digital circuits including one or more of a logic gate, an integrated circuit, a microprocessor, a microcontroller, a memory circuit, a passive electronic component, an active electronic component, an optical component, and the like, and may also be implemented by or driven by software and/or firmware (configured to perform the functions or operations described herein).

As used herein, each of the terms "SiO", "SiN", and the like may refer to a material made of elements included in each of the terms and is not a chemical formula representing a stoichiometric relationship.

Hereinafter, various embodiments of the present disclosure are described with reference to the accompanying drawings.

FIG. 1 is a block diagram of a memory system 100, according to an embodiment.

Referring to FIG. 1, the memory system 100 may include a memory controller 110 and at least one memory device 120. In an embodiment of FIG. 1, a plurality of conceptual hardware configurations included in the memory system 100 are illustrated. However, the present disclosure is not limited thereto, and other configurations not shown in FIG. 1 may be additionally included. The memory controller 110 may control the memory device 120 to write data in the memory device 120 in response to a write request from a host. Alternatively or additionally, the memory controller 110 may control the memory device 120 to read data stored in the memory device 120 in response to a read request from the host.

In some embodiments, the memory system 100 may be and/or may include an internal memory embedded in an electronic device. For example, the memory system 100 may be and/or may include, but not be limited to, an embedded universal flash storage (UFS) memory device, an embedded multi-media card (eMMC), a solid state drive (SSD), and/or the like. In some embodiments, the memory system 100 may be and/or may include an external memory that may be detachable from an electronic device. For example, the memory system 100 may be and/or may include, but not be limited to, at least one of a UFS memory card, compact flash (CF), secure digital (SD), micro secure digital (Micro-SD), mini secure digital (Mini-SD), extreme Digital (xD), and memory stick.

The memory device 120 may perform at least one of an erase operation, a program (e.g., write) operation, and a read operation under the control of the memory controller 110. The memory device 120 may receive a command CMD and/or an address ADDR from the memory controller 110 through an input/output line and may transmit and/or receive data DATA for a program operation and/or a read operation to and/or from the memory controller 110. Alternatively or additionally, the memory device 120 may receive a control signal CTRL through a control line. The memory device 120 may include a memory cell array 121, a pass transistor (TR) circuit 122, a row decoder 123, a voltage generator 124, and a control circuit 125.

The memory cell array 121 may include a plurality of memory blocks. Each memory block of the plurality of memory blocks may include a plurality of memory cells. Alternatively or additionally, each memory block of the plurality of memory blocks may include a plurality of word lines. The plurality of word lines may connect (e.g., couple) the plurality of memory cells to each other.

The pass transistor (TR) circuit 122 may include a plurality of pass transistors connected to the plurality of word lines. Each pass transistor of the plurality of pass transistors may selectively output a voltage applied to a second terminal (e.g., a source terminal) to each word line of the plurality of word lines through a third terminal (e.g., a drain terminal) based on a voltage applied to a first terminal (e.g., a gate terminal).

The row decoder 123 may provide a block selection voltage to first terminals of the plurality of pass transistors. Alternatively or additionally, the row decoder 123 may provide a driving voltage to the second terminals of the plurality of pass transistors.

The voltage generator 124 may generate a block selection voltage and a driving voltage. For example, the voltage generator 124 may provide the generated block selection voltage and the generated driving voltage to the row decoder 123.

The control circuit 125 may control the row decoder 123 and the voltage generator 124. For example, the control circuit 125 may control the voltage generator 124 to adjust voltage levels of the block selection voltage and the driving voltage generated through the voltage generator 124. Alternatively or additionally, the control circuit 125 may control the row decoder 123 to determine whether voltage is provided to the plurality of pass transistors through the row decoder 123.

The control circuit 125 may perform a leakage detection operation on the plurality of memory blocks. In an embodiment, the control circuit 125 may, when performing a leakage detection operation on a leakage detection target memory block from among the plurality of memory blocks, apply a driving voltage to second terminals of the plurality of pass transistors connected to a plurality of first detection word lines of the leakage detection target memory block so as to set the plurality of first detection word lines to a first voltage level. In such an embodiment, the control circuit 125 may apply a driving voltage to second terminals of the plurality of pass transistors connected to a plurality of second detection word lines of the leakage detection target memory block so as to set the plurality of second detection word lines to a second voltage level that is lower than the first voltage level. Alternatively or additionally, the control circuit 125 may apply a driving voltage to second terminals of the plurality of pass transistors connected to one or more string select lines and one or more ground select lines of the leakage detection target memory block so as to set up the one or more string select lines and the one or more ground select lines to a cut-off voltage level.

Accordingly, when the memory device 120 performs the leakage detection operation, by setting the plurality of first detection word lines to the first voltage level and setting the plurality of second detection word lines to the second voltage level, leakage occurring in all of the word lines may be detected more quickly when compared to a related memory device. The leakage detection operation of the memory device 120 is described with reference to FIG. 2.

Figure 2:
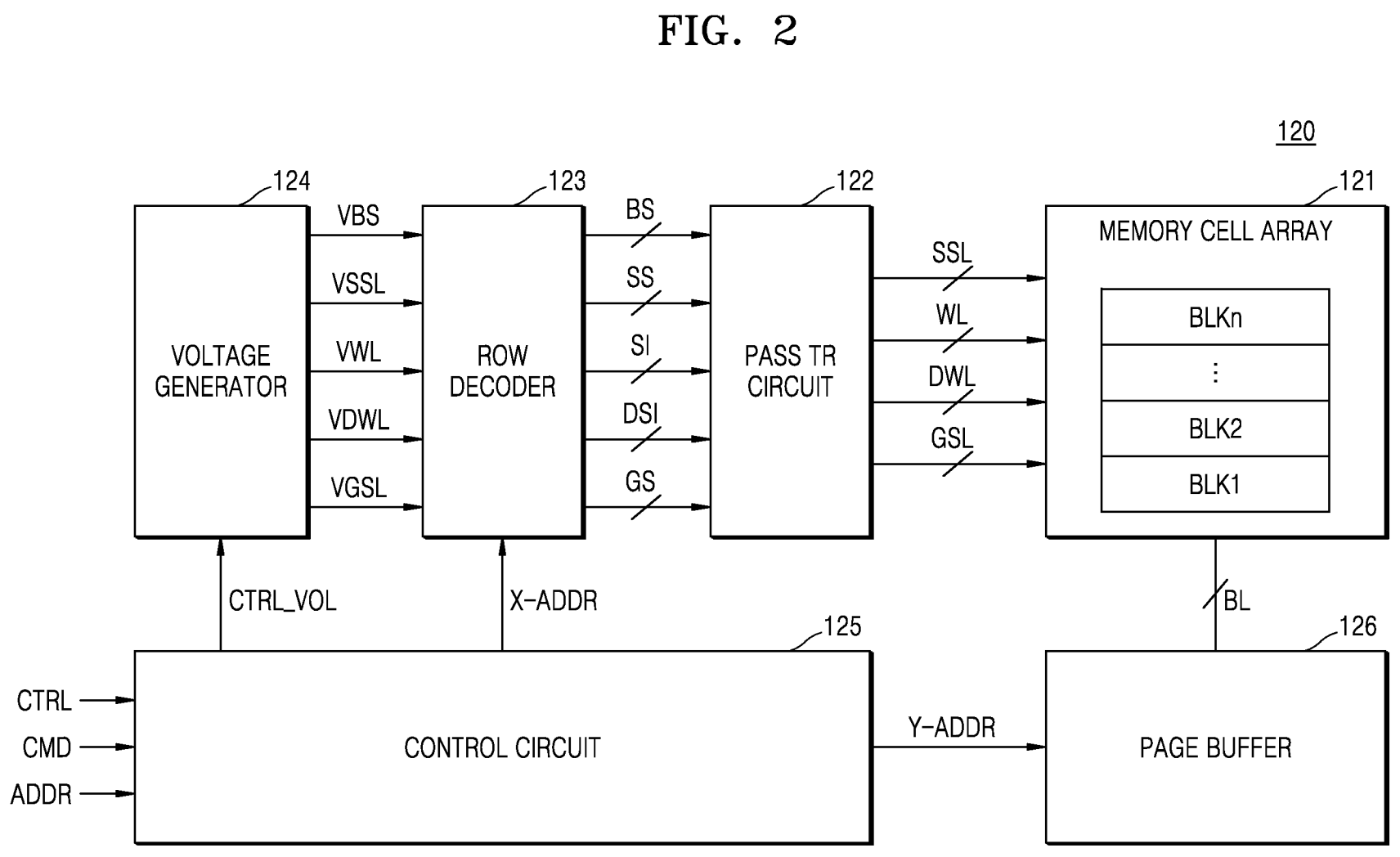

FIG. 2 is a block diagram of a memory device 120, according to an embodiment.

Referring to FIG. 2, the memory device 120 may include a memory cell array 121, a pass transistor (TR) circuit 122, a row decoder 123, a voltage generator 124, a control circuit 125, and a page buffer 126. In an embodiment, the memory device 120 may include other elements such as, but not limited to, an input/output (I/O) interface.

The memory cell array 121 may include a plurality of word lines WL, one or more dummy word lines DWL, one or more string select lines SSL, one or more ground select lines GSL, and a plurality of bit lines BL. The memory cell array 121 may be connected to the pass transistor circuit 122 through the plurality of word lines WL, the one or more dummy word lines DWL, the one or more string select lines SSL, and the one or more ground select lines GSL. Alternatively or additionally, the memory cell array 121 may be connected to the page buffer 126 through the plurality of bit lines BL.

The memory cell array 121 may include a plurality of memory blocks (e.g., first memory block BLK1, second memory block BLK2, to n$^{th}$ memory block BLKn, where n is a positive integer greater than one (1), hereinafter generally referred to as "BLK"). Each memory block of the plurality of memory blocks BLK may include a plurality of memory cells. For example, the plurality of memory cells may be and/or may include flash memory cells. Hereinafter, embodiments are described below based on a case in which the plurality of memory cells are NOT-AND (NAND) flash memory cells as an example. However, the present disclosure is not limited thereto, and the plurality of memory cells may be implemented using other types of memory cells. For example, in some embodiments, the plurality of memory cells may be and/or may include, but not be limited to, resistive memory cells, such as resistive random access memory (ReRAM), phase change random access memory (PRAM), magnetic random access memory (MRAM), and the like.

In an embodiment, the memory cell array 121 may be and/or may include a three-dimensional (3D) memory cell array. For example, the 3D memory cell array may be and/or may include a plurality of NAND strings. Each NAND string of the plurality of NAND strings may include memory cells respectively connected to word lines vertically stacked on a substrate. An example structure of a memory device is described with reference to FIG. 3. U.S. Pat. Nos. 7,679,133, 8,553,466, 8,654,587, 8,559,235, and 9,536,970, disclose suitable configurations for a 3D memory array including a plurality of levels and having word lines and/or bit lines shared between the levels, the disclosures of which are incorporated by reference herein in their entireties. However, the present disclosure is not limited thereto. For example, in some embodiments, the memory cell array 121 may include a two-dimensional (2D) memory cell array. The 2D memory cell array may include a plurality of NAND strings arranged in row and column directions.

The control circuit 125 may, based on the command CMD, the address ADDR, and/or the control signal CTRL, which may be transmitted from the memory controller 110, program data into the memory cell array 121, read data from the memory cell array 121, and/or generate various control signals for erasing data stored in the memory cell array 121. For example, the control circuit 125 may provide a voltage control signal CTRL_VOL to the voltage generator 124, provide a row address X-ADDR to the row decoder 123, and provide a column address Y-ADDR to the page buffer 126. Accordingly, the control circuit 125 may control various operations of the memory device 120 as a whole.

In an embodiment, the control circuit 125 may perform a leakage detection operation on a leakage detection target memory block from among the plurality of memory blocks BLK included in the memory cell array 121.

The leakage detection target memory block may refer to a memory block for detecting whether leakage occurs in the plurality of word lines WL of the plurality of memory blocks BLK. In an embodiment, the control circuit 125 may set a memory block in which stored data is erased from among the plurality of memory blocks BLK as a leakage detection target memory block.

The control circuit 125 may control the row decoder 123 through the row address X-ADDR and/or the voltage control signal CTRL_VOL to set voltage levels of the plurality of word lines WL, the one or more dummy word lines DWL, the one or more string select lines SSL, and the one or more ground select lines GSL so as to perform a leakage detection operation on the leakage detection target memory block.

The voltage generator 124 may generate a voltage supplied to the memory cell array 121. That is, the voltage generator 124 may generate various types of voltages for performing write operations, read operations, and/or erase operations on the memory cell array 121 based on the voltage control signal CTRL_VOL. For example, the voltage generator 124 may generate a program voltage, a verify voltage, a read voltage, a pass voltage, an erase voltage, an erase verify voltage, and the like.

In an embodiment, the voltage generator 124 may generate a block selection voltage VBS, a string select line driving voltage VSSL, a word line driving voltage VWL, a dummy word line driving voltage VDWL, and a ground select line driving voltage VGSL, which may be used for a leakage detection operation, based on the voltage control signal CTRL_VOL. In such an embodiment, the string select line driving voltage VSSL, the word line driving voltage VWL, the dummy word line driving voltage VDWL, and the ground select line driving voltage VGSL may be referred to as driving voltages.

The row decoder 123 may output the block selection voltage VBS for selecting one of the plurality of memory blocks to a plurality of block selection signal lines BS in response to the row address X-ADDR. Alternatively or additionally, the row decoder 123 may, in response to the row address X-ADDR, output the string select line driving voltage VSSL to one or more string select line driving signal lines SS, output the word line driving voltage VWL to a plurality of word line driving signal lines SI, output the dummy word line driving voltage VDWL to one or more dummy word line driving signal lines DSI, and output the ground select line driving voltage VGSL to one or more ground select line driving signal lines GS.

The page buffer 126 may select some bit lines from among the plurality of bit lines BL in response to the column address Y-ADDR. For example, the page buffer 240 may operate as a write driver and/or a sense amplifier, according to an operation mode.

The pass transistor circuit 122 may be connected to the row decoder 123 through the plurality of block selection signal lines BS, the one or more string select line driving signal lines SS, the plurality of word line driving signal lines SI, the one or more dummy word line driving signal lines DSI, and the one or more ground select line driving signal lines GS. The one or more string select line driving signal lines SS, the plurality of word line driving signal lines SI, the one or more dummy word line driving signal lines DSI, and the one or more ground select line driving signal lines GS may be referred to as driving signal lines.

The pass transistor (TR) circuit 122 may include a plurality of pass transistors. The plurality of pass transistors may be controlled by the block selection voltage VBS applied through the plurality of block selection signal lines BS. The plurality of pass transistors may provide the string select line driving voltage VSSL, the word line driving voltage VWL, the dummy word line driving voltage VDWL, and the ground select line driving voltage VGSL to the one or more string select lines SSL, the plurality of word lines WL, the one or more dummy word lines DWL, and the one or more ground select lines GSL, respectively.

Figure 3:
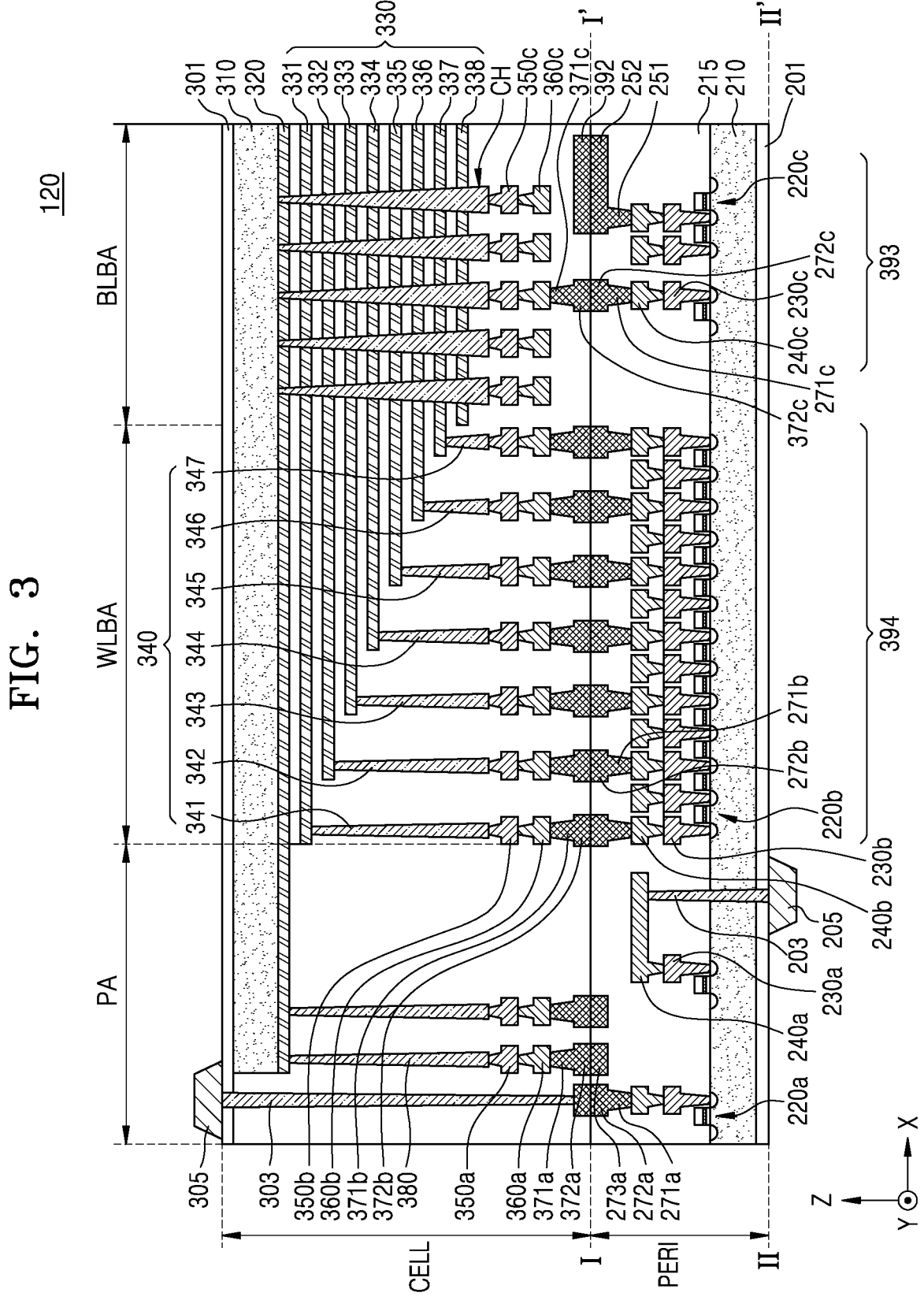
FIG. 3 is a diagram illustrating a structure of a memory device, according to an embodiment.

FIG. 3 is a diagram illustrating a structure of a memory device, according to an embodiment.

Referring to FIG. 3, a memory device 120 may have a chip-to-chip (C2C) structure. The C2C structure may refer to a structure formed by manufacturing an upper chip that may include a cell region CELL on a first wafer, manufacturing a lower chip that may include a peripheral circuit region PERI on a second wafer, different from the first wafer, and connecting the upper chip and the lower chip in a bonding manner. For example, the bonding manner may include a method of electrically connecting a bonding metal formed on an uppermost metal layer of the upper chip and a bonding metal formed on an uppermost metal layer of the lower chip. For another example, when the bonding metals are formed of copper (Cu), the bonding manner may be a Cu—Cu bonding, In an optional or additional embodiment, the bonding metals may be formed of aluminum (Al) and/or tungsten (W). However, the present disclosure is not limited in this regard.

Each of the peripheral circuit region PERI and the cell region CELL of the memory device 120 may include an external pad bonding area PA, a word line bonding area WLBA, and a bit line bonding area BLBA.

The peripheral circuit region PERI may include a first substrate 210, an interlayer insulating layer 215, a plurality of circuit elements (e.g., first circuit element 220a, second circuit element 220b, and third circuit element 220c, hereinafter generally referred to as "220") formed on the first substrate 210, first metal layers (e.g., first metal layer A 230a, first metal layer B 230b, and first metal layer C 230c) respectively connected to the plurality of circuit elements 220, and second metal layers (e.g., second metal layer A 240a, second metal layer B 240b, and second metal layer C 240c) formed on the first metal layers 230a to 230c. In an example embodiment, the first metal layers 230a to 230c may be formed of tungsten (W) having a relatively high resistance. Alternatively or additionally, the second metal layers 240a to 240c may be formed of copper (Cu) having a relatively low resistance.

Although the first metal layers 230a to 230c and the second metal layers 240a to 240c are described as shown in FIG. 3, the present disclosure is not limited thereto. For example, one or more metal layers may be further formed on the second metal layers 240a to 240c. At least a portion of the one or more metal layers formed on the second metal layers 240a to 240c may be formed of aluminum (Al) or the like having a lower resistance than the one or more copper metal layers forming the second metal layers 240a to 240c.

The interlayer insulating layer 215 may be disposed on the first substrate 210. The interlayer insulating layer 215 may cover at least a portion of the plurality of circuit elements 220, the first metal layers 230a to 230c, and the second metal layers 240a to 240c. The interlayer insulating layer 215 may include an insulating material such as, but not limited to, silicon oxide (SiO), silicon nitride (SiN), or the like.

Lower bonding metals (e.g., first lower bonding metal 271b and second lower bonding metal 272b) may be formed on the second metal layer B 240b in the word line bonding area WLBA. In the word line bonding area WLBA, the first and second lower bonding metals 271b and 272b in the peripheral circuit region PERI may be electrically connected to upper bonding metals (e.g., first upper bonding metal 371b and second upper bonding metal 372b) in the cell region CELL in a bonding manner. In an embodiment, the first and second lower bonding metals 271b and 272b and the first and second upper bonding metals 371b and 372b may be formed of at least one metal such as, but not limited, to, aluminum (Al), copper (Cu), tungsten (W), and the like.

The cell region CELL may include at least one memory block. The cell region CELL may include a second substrate 310 and a common source line 320. On the second substrate 310, a plurality of word lines (e.g. first word line 331, second word line 332, third word line 333, fourth word line 334, fifth word line 335, sixth word line 336, seventh word line 337, and eighth word line 338, hereinafter generally referred to as "330") may be stacked in a direction (e.g., a Z-axis direction), that may be perpendicular to an upper surface of the second substrate 310. At least one string select line and at least one ground select line may be arranged on and/or below the plurality of word lines 330, respectively. Alternatively or additionally, the plurality of word lines 330 may be disposed between the at least one string select line and the at least one ground select line.

In the bit line bonding area BLBA, a channel structure CH may extend in a direction, which may be perpendicular to the upper surface of the second substrate 310, and pass through the plurality of word lines 330, the at least one string select line, and the at least one ground select line. The channel structure CH may include a data storage layer, a channel layer, a buried insulating layer, and the like. Alternatively or additionally, the channel layer may be electrically connected to a third metal layer C 350c and a fourth metal layer C 360c. For example, the third metal layer C 350c may be and/or may include a bit line contact. For another example, the fourth metal layer C 360c may be and/or may include a bit line. In an embodiment, the fourth bit line C 360c may extend in a first direction (e.g., a Y-axis direction), which may be parallel to the upper surface of the second substrate 310.

As shown in FIG. 3, an area in which the channel structure CH, the fourth bit line C 360c, and the like are disposed may be referred to as the bit line bonding area BLBA. In the bit line bonding area BLBA, the fourth bit line C 360c may be electrically connected to the third circuit element 220c providing a page buffer 393 in the peripheral circuit region PERI. For example, the fourth bit line C 360c may be connected to upper bonding metals (e.g., third upper bonding metal 371c and fourth upper bonding metal 372c) in the cell region CELL. In such an example, the third and fourth upper bonding metals 371c and 372c may be connected to lower bonding metals (e.g., third lower bonding metal 271c and fourth lower bonding metal 272c) connected to the third circuit element 220c of the page buffer 393.

In the word line bonding area WLBA, the plurality of word lines 330 may extend in a second direction (e.g., an X-axis direction), which may be parallel to the upper surface of the second substrate 310. The plurality of word lines 330 may be connected to a plurality of cell contact plugs (e.g., first cell contact plug 341, second cell contact plug 342, third cell contact plug 343, fourth cell contact plug 344, fifth cell contact plug 345, sixth cell contact plug 346, and seventh cell contact plug 347, hereinafter generally referred to as "340"). The plurality of word lines 330 and the plurality of cell contact plugs 340 may be connected to each other in pads provided by at least a portion of the plurality of word lines 330 extending in different lengths in the second direction. A third metal layer B 350b and a fourth metal layer B 360b may be sequentially connected to an upper portion of the plurality of cell contact plugs 340 connected to the plurality of word lines 330. The plurality of cell contact plugs 340 may be connected to the circuit region PERI by the first and second upper bonding metals 371b and 372b of the cell region CELL and the first and second lower bonding metals 271b and 272b of the peripheral circuit region PERI in the word line bonding area WLBA.

The plurality of cell contact plugs 340 may be electrically connected to the circuit elements 220b providing a row decoder 394 in the peripheral circuit region PERI. In an example embodiment, operating voltages of the circuit elements 220b providing the row decoder 394 may be different than operating voltages of the circuit elements 220c providing the page buffer 393. For example, operating voltages of the circuit elements 220c providing the page buffer 393 may be greater than operating voltages of the circuit elements 220b providing the row decoder 394.

A common source line contact plug 380 may be disposed in the external pad bonding area PA. The common source line contact plug 380 may be formed of a conductive material such as, but not limited to, a metal, a metal compound, polysilicon, and the like. Alternatively or additionally, the common source line contact plug 380 may be electrically connected to the common source line 320. A third metal layer A 350a and a fourth metal layer A 360a may be sequentially stacked on an upper portion of the common source line contact plug 380. For example, an area in which the common source line contact plug 380, the third metal layer A 350a, and the fourth metal layer A 360a are disposed may be referred to as the external pad bonding area PA.

Input/output (I/O) pads (e.g., first I/O pad 205 and second I/O pad 305) may be disposed in the external pad bonding area PA. Continuing to refer to FIG. 3, a lower insulating film 201 that may be covering at least a portion of a lower surface of the first substrate 210 may be formed below the first substrate 210. Alternatively or additionally, the first I/O pad 205 may be formed on the lower insulating film 201. The first I/O pad 205 may be connected to at least one of the plurality of circuit elements 220 disposed in the peripheral circuit region PERI through a first I/O contact plug 203. The first I/O pad 205 may be separated from the first substrate 210 by the lower insulating film 201. Alternatively or additionally, a side insulating film may be disposed between the first I/O contact plug 203 and the first substrate 210 to electrically separate the first I/O contact plug 203 and the first substrate 210.

As shown in FIG. 3, an upper insulating film 301 covering at least a portion of the upper surface of the second substrate 310 may be formed on the second substrate 310. Alternatively or additionally, a second I/O pad 305 may be disposed on the upper insulating layer 301. The second I/O pad 305 may be connected to at least one of the plurality of circuit elements 220 disposed in the peripheral circuit region PERI through a second I/O contact plug 303.

According to some embodiments, the second substrate 310 and the common source line 320 may not be disposed in an area in which the second I/O contact plug 303 is disposed. Alternatively or additionally, the second I/O pad 305 may not overlap the word lines 330 in the third direction (e.g., the Z-axis direction). As shown in FIG. 3, the second I/O contact plug 303 may be separated from the second substrate 310 in a direction, which may be parallel to the upper surface of the second substrate 310. Alternatively or additionally, the second I/O contact plug 303 may pass through the interlayer insulating layer 315 of the cell region CELL to be connected to the second I/O pad 305.

According to some embodiments, the first I/O pad 205 and the second I/O pad 305 may be selectively formed. For example, the memory device 120 may include only the first I/O pad 205 disposed on the first substrate 210 or the second I/O pad 305 disposed on the second substrate 310. Alternatively or additionally, the memory device 120 may include both the first I/O pad 205 and the second I/O pad 305.

A metal pattern in an uppermost metal layer may be provided as a dummy pattern or the uppermost metal layer may be absent, in each of the external pad bonding area PA and the bit line bonding area BLBA, respectively included in the cell region CELL and the peripheral circuit region PERI.

In the external pad bonding area PA, the memory device 120 may include a lower metal pattern 273a, corresponding to an upper metal pattern 372a formed in an uppermost metal layer of the cell region CELL. The lower metal pattern 273a may have a substantially similar and/or the same shape as the upper metal pattern 372a of the cell region CELL, in an uppermost metal layer of the peripheral circuit region PERI. In the peripheral circuit region PERI, the lower metal pattern 273a formed in the uppermost metal layer of the peripheral circuit region PERI may not be connected to a contact. Similarly, in the external pad bonding area PA, an upper metal pattern, corresponding to the lower metal pattern formed in an uppermost metal layer of the peripheral circuit region PERI, and having a substantially similar and/or the same shape as a lower metal pattern of the peripheral circuit region PERI, may be formed in an uppermost metal layer of the cell region CELL.

The first and second lower bonding metals 271b and 272b may be formed on the second metal layer 240b in the word line bonding area WLBA. In the word line bonding area WLBA, the first and second lower bonding metals 271b and 272b of the peripheral circuit region PERI may be electrically connected to the first and second upper bonding metals 371b and 372b of the cell region CELL by a Cu—Cu bonding.

In an embodiment, in the bit line bonding area BLBA, an upper metal pattern 392, corresponding to a lower metal pattern 252 formed in the uppermost metal layer of the peripheral circuit region PERI, and having a substantially similar and/or the same shape as the lower metal pattern 252 of the peripheral circuit region PERI, may be formed in an uppermost metal layer of the cell region CELL. In an optional or additional embodiment, a contact may not be formed on the upper metal pattern 392 formed in the uppermost metal layer of the cell region CELL.

In an example embodiment, corresponding to a metal pattern formed in an uppermost metal layer in one of the cell region CELL and the peripheral circuit region PERI, a reinforcement metal pattern having a substantially similar and/or the same shape as the metal pattern may be formed in an uppermost metal layer in another one of the cell region CELL and the peripheral circuit region PERI. In such an embodiment, a contact may not be formed on the reinforcement metal pattern.

Figure 4:
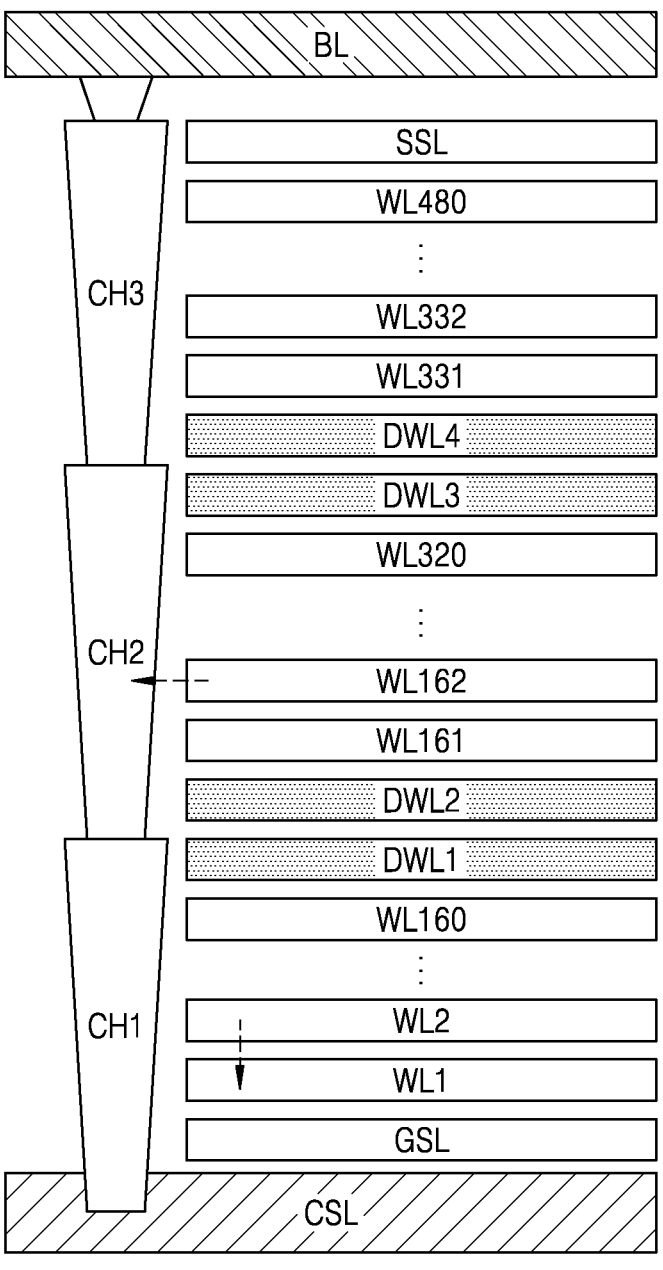
FIG. 4 is a diagram illustrating an arrangement of a plurality of word lines of a memory block, according to an embodiment.

FIG. 4 is a diagram illustrating an arrangement of a plurality of word lines of a memory block, according to an embodiment.

The memory block shown in FIG. 4 may illustrate at least one memory block of the plurality of memory blocks BLK described with reference to FIG. 2.

Referring to FIG. 4, the memory block, according to an embodiment, may include a bit line BL, a common source line CSL, a plurality of channels (e.g., first channel CH1, second channel CH2, and third channel CH3, hereinafter generally referred to as "CH"), a string select line SSL, and a plurality of word lines (e.g., first word line WL1 to $480^{th}$ word line WL480, hereinafter generally referred to as "WL"), a plurality of dummy word lines (e.g., first dummy word line DWL1, second dummy word line DWL2, third dummy word line DWL3, and fourth dummy word line DWL4, hereinafter generally referred to as "DWL"), and a ground select line GSL. Although FIG. 4 illustrates a memory block having three (3) channels, one (1) string select line, 480 word lines, four (4) dummy word lines, and one (1) ground select line, the present disclosure is not limited in this regard. For example, the number of channels CH, the number of string select lines SSL, the number of word lines WL, the number of dummy word lines DWL, and the number of ground select lines GSL may be variously modified, according to some embodiments.

The bit line BL and the common source line CSL may be connected to each other through the plurality of channels CH. The plurality of channels CH may penetrate through the string select line SSL, the plurality of word lines WL, the plurality of dummy word lines DWL, and the ground select line GSL. In such an embodiment, the first channel CH1 may penetrate through the ground select line GSL, the first to $160^{th}$ word lines WL1 to WL160, and the first dummy word line DWL1. Alternatively or additionally, the second channel CH2 may penetrate through the second dummy word line DWL2, the $161^{th}$ to $320^{th}$ word lines WL161 to WL320, and the third dummy word line DWL3. For another example, the third channel CH3 may penetrate through the fourth dummy word line DWL4, the $321^{th}$ to $480^{th}$ word lines WL321 to WL480, and the string select line SSL. However, the present disclosure is not limited in this regard, and each channel of the plurality of channels CH may penetrate different combinations of ground select lines, string select lines, dummy word lines, and word lines without departing from the scope of the present disclosure.

The string select line SSL, the plurality of word lines WL, the plurality of dummy word lines DWL, and the ground select line GSL may be a layered structure between the bit line BL and the common source line CSL.

For example, as shown FIG. 4, the ground select line GSL may be stacked on the common source line CSL, the first to $160^{th}$ word lines WL1 to WL160 may be sequentially stacked on the ground select line GSL, and the first dummy word line DWL1 may be stacked on the $160^{th}$ word line WL160. Alternatively or additionally, the second dummy word line DWL2 may be stacked on the first dummy word line DWL1, the $161^{th}$ to $320^{th}$ word lines WL161 to WL320 may be sequentially stacked on the second dummy word line DWL2, and the third dummy word line DWL3 may be stacked on the $320^{th}$ word line WL320. Alternatively or additionally, the fourth dummy word line DWL4 may be stacked on the third dummy word line DWL3, the $321^{st}$ to $480^{th}$ word lines WL321 to WL480 may be sequentially stacked on the fourth dummy word line DWL4, and the string select line SSL may be stacked on the $480^{th}$ word line WL480.

When degradation occurs in the memory device 120, leakage may occur in the plurality of word lines WL. That is, leakage may occur between word lines or between a word line and a channel of the memory device 120.

For example, the leakage between word lines may refer to a current flowing to the first word line WL1 from the second word line WL2 as indicated by a dotted line in FIG. 4. Alternatively or additionally, the leakage between a word line and a channel may refer to a current flowing to the second channel CH2 from the $162^{nd}$ word line WL162 as indicated by a dotted line in the drawing. Hereinafter, leakage between word lines may be referred to as leakage in a first direction. Alternatively or additionally, leakage between a word line and a channel may be referred to as leakage in a second direction.

Figure 5:
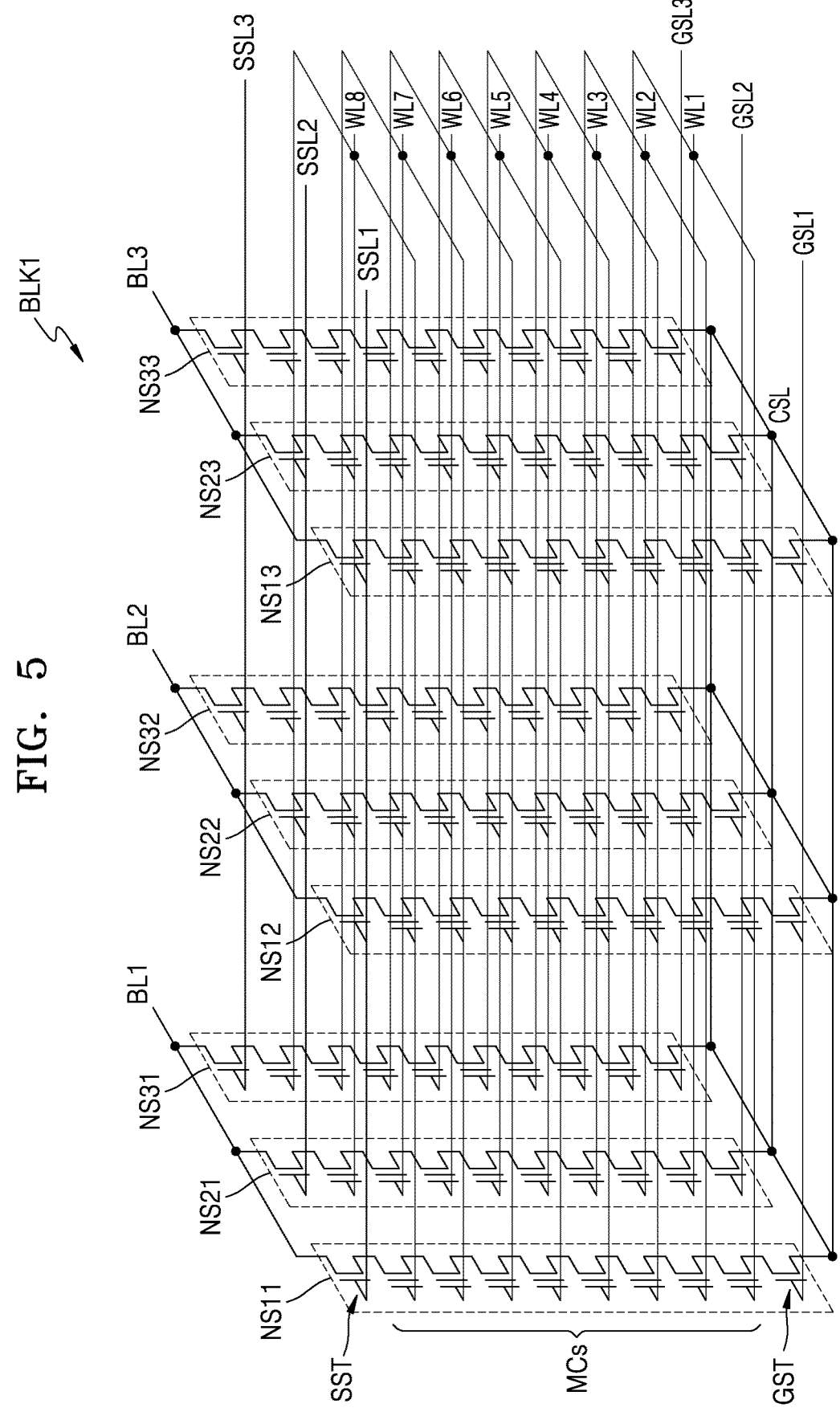
FIG. 5 is a circuit diagram illustrating a memory block of a memory device, according to an embodiment.

FIG. 5 is a circuit diagram illustrating a memory block of a memory device, according to an embodiment.

The memory block shown in FIG. 5 illustrates an example memory block from among the plurality of memory blocks BLK described with reference to FIG. 2, and shows the first memory block BLK1. Hereinafter, embodiments are described below by using the first memory block BLK1 as an example. The first memory block BLK1 represents a 3D memory block formed in a 3D structure on a substrate. A plurality of memory cell strings included in the first memory block BLK1 may be formed in a direction perpendicular to the substrate.

Referring to FIG. 5, the first memory block BLK1 may include a plurality of NAND strings (e.g., first NAND string NS11, second NAND string NS12, third NAND string NS13, fourth NAND string NS21, fifth NAND string NS22, sixth NAND string NS23, seventh NAND string NS31, eighth NAND string NS32, and ninth NAND string NS33, hereinafter generally referred to as "NS"), a plurality of word lines (e.g., first word line WL1, second word line WL2, third word line WL3, fourth word line WL4, fifth word line WL5, sixth word line WL6, seventh word line WL7, and eighth word line WL8, hereinafter generally referred to as "WL"), a plurality of bit lines (e.g., first bit line BL1, second bit line BL2, and third bit line BL3, hereinafter generally referred to as "BL"), a plurality of ground select lines (e.g., first ground select line GSL1, second ground select line GSL2, and third ground select line GSL3 hereinafter generally referred to as "GSL"), a plurality of string select lines (e.g., first string select line SSL1, second string select line SSL2, and third string select line SSL3, hereinafter generally referred to as "SSL"), and a common source line CSL. As shown in FIG. 5, each cell string of the plurality of cell strings NS may include eight memory cells MCs respectively connected to the plurality of word lines WL. However, the present disclosure is not limited thereto. For example, the number of NAND strings NS, the number of word lines WL, the number of bit lines BL, the number of ground select lines GSL, and/or the number of string select lines SSL may be variously modified, according to some embodiments.

Each of the cell strings (e.g., NS11) may include a string select transistor SST, a plurality of memory cells MC, and a ground select transistor GST, which may be connected in series to each other. The string select transistor SST may be connected to a corresponding string select line (e.g., SSL1). Each memory cell of the plurality of memory cells MC may be connected to a corresponding word line of the plurality of word lines WL. The ground select transistor GST may be connected to the corresponding ground select line (e.g., GSL1). The string select transistor SST may be connected to a corresponding bit line of the plurality of bit lines BL. The ground select transistor GST may be connected to the common source line CSL.

In some embodiments, each of the cell strings (e.g., NS11) may provide one or more dummy memory cells between the string select transistor SST and the memory cells MC. Alternatively or additionally, each of the cell strings (e.g., NS11) may provide one or more dummy memory cells between the ground select transistor GST and the memory cells MC. In an optional or additional embodiment, each of the cell strings (e.g., NS11) may provide one or more dummy memory cells between the memory cells MC.

The plurality of dummy memory cells may have a substantially similar and/or the same structure as the memory cells MC. The plurality of dummy memory cells may be connected through a dummy word line. The plurality of dummy memory cells may be unprogrammed (e.g., program inhibited). Alternatively or additionally, the plurality of dummy memory cells may be programmed differently from the memory cells MC. For example, when the plurality of memory cells MC are programmed to have two or more threshold voltage distributions, the plurality of dummy memory cells may be programmed to have one threshold voltage distribution range and/or less memory cells than the plurality of memory cells MC.

Figure 6:
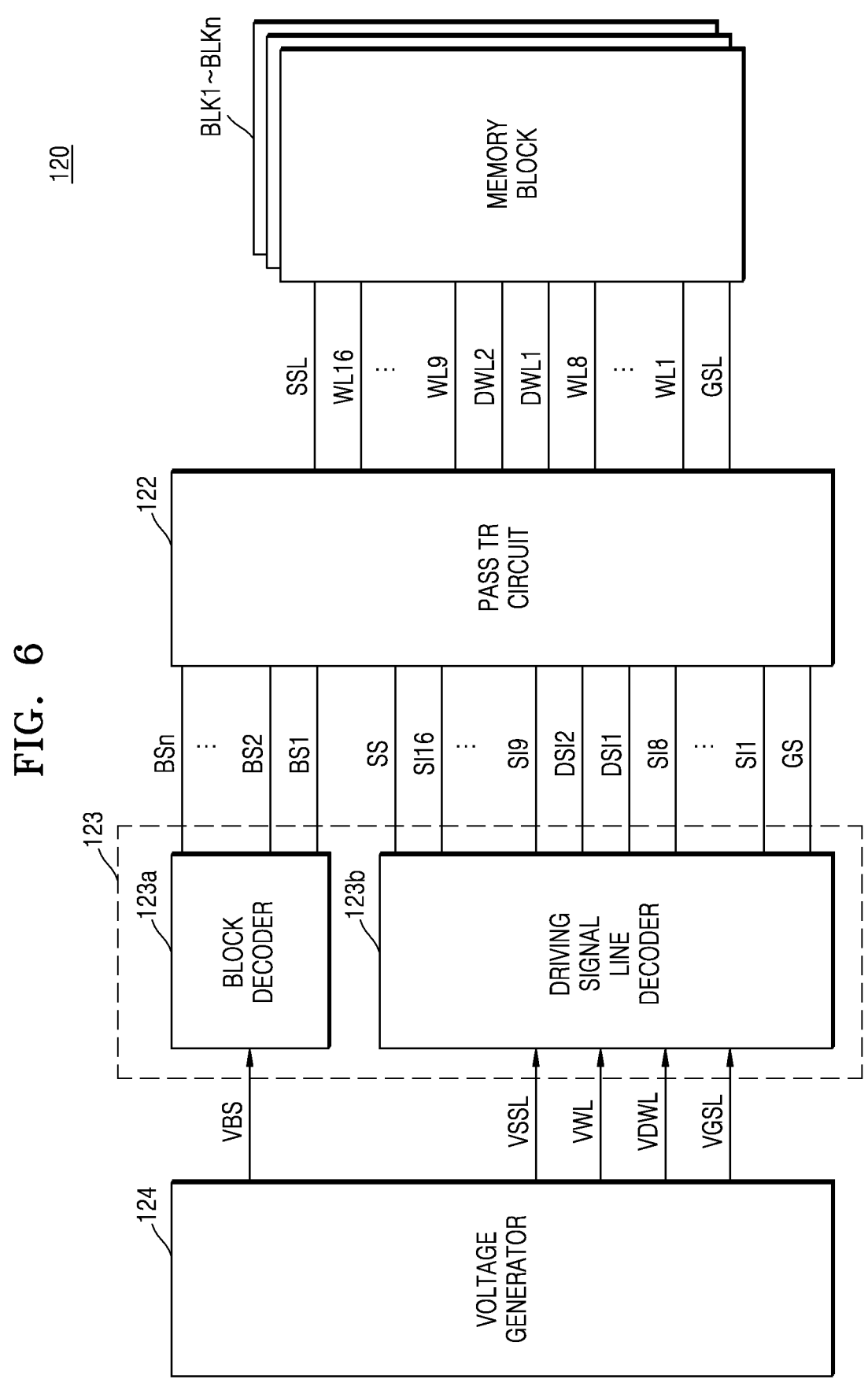
FIG. 6 is a block diagram of a memory device, according to an embodiment, focusing on a voltage application path.

FIG. 6 is a block diagram of a memory device, according to an embodiment, focusing on a voltage application path.

Referring to FIG. 6, the memory device 120 may include a voltage generator 124, a row decoder 123, a pass transistor (TR) circuit 122, and a plurality of memory blocks (e.g., first memory block BLK1 to $n^{th}$ memory block BLKn, where n is a positive integer greater than one (1), hereinafter generally referred to as "BLK").

The voltage generator 124 may output the block selection voltage VBS, the string select line driving voltage VSSL, the word line driving voltage VWL, the dummy word line driving voltage VDWL, and/or the ground select line driving voltage VGSL to the row decoder 123.

The row decoder 123 may include a block decoder 123a and a driving signal line decoder 123b.

The block decoder 123a may receive the block selection voltage VBS from the voltage generator 124. The block decoder 123a may apply the block selection voltage VBS to the pass transistor (TR) circuit 122.

The block decoder 123a may be connected to the pass transistor circuit 122 through the plurality of block selection signal lines (e.g., first block selection signal line BS1, second block selection signal line BS2, to $n^{th}$ block selection signal line BSn, hereinafter generally referred to as "BS"). The block decoder 123a may apply the block selection voltage VBS to the pass transistor circuit 122 through the plurality of block selection signal lines BS. For example, the block decoder 123a may be connected to a plurality of pass transistors connected to a kth memory block BLKk from among a plurality of pass transistors included in the pass transistor circuit 122 through a kth block selection signal line BSk, where k is a positive integer greater than zero (0) and less than or equal to n). In such an example, the block decoder 123a may apply the block selection voltage VBS to the plurality of pass transistors connected to the kth memory block BLKk from among the plurality of pass transistors through the kth block selection signal line BSk.

The driving signal line decoder 123b may receive the string select line driving voltage VSSL, the word line driving voltage VWL, the dummy word line driving voltage VDWL, and the ground select line driving voltage VGSL from the voltage generator 124. The driving signal line decoder 123b may apply the string select line driving voltage VSSL, the word line driving voltage VWL, the dummy word line driving voltage VDWL, and the ground select line driving voltage VGSL to the pass transistor circuit 122.

The driving signal line decoder 123b may be connected to the pass transistor circuit 122 through a string select line driving signal line SS, a plurality of word line driving signal lines (e.g., first word line driving signal line SI1 to sixteenth word line driving signal line SI16, hereinafter generally referred to as "SI"), a plurality of dummy word line driving signal lines (e.g., first dummy word line driving signal line DSI1 to second dummy word line driving signal line DSI2, hereinafter generally referred to as "DS"), and a ground select line driving signal line GS. The driving signal line decoder 123b may apply the string select line driving voltage VSSL through the string select line driving signal line SS, apply the word line driving voltage VWL through the plurality of word line driving signal lines SI, apply the dummy word line driving voltage VDWL through the plurality of dummy word line driving signal lines DS, and apply the ground select line driving voltage VGSL to the pass transistor circuit 122 through the ground select line driving signal line GS.

In such an embodiment, the string select line driving signal line SS may be connected to the plurality of pass transistors connected to the string select lines SSL of the plurality of memory blocks BLK. The plurality of word line driving signal lines SI may be connected to a plurality of pass transistors connected to the plurality of word lines WL of the plurality of memory blocks BLK. The plurality of dummy word line driving signal lines DS may be connected to a plurality of pass transistors connected to a plurality of dummy word lines (e.g., first dummy word line DWL1 to second dummy word line DWL2, hereinafter generally referred to as "DWL") of the plurality of memory blocks BLK. The ground select line driving signal line GS may be connected to a plurality of pass transistors connected to the ground select lines GSL of the plurality of memory blocks BLK.

The pass transistor circuit 122 may be connected to the plurality of block selection signal lines BS connected to the block decoder 123a. The pass transistor circuit 122 may be connected to driving signal lines connected to the driving signal line decoder 123b. The pass transistor circuit 122 may be connected to the string select line SSL, the plurality of word lines WL, the plurality of dummy word lines DWL, and the ground select line GSL, which may be each connected to the plurality of memory blocks BLK. An example of a connection structure of the pass transistor circuit 122 is described with reference to FIG. 7.

Figure 7:
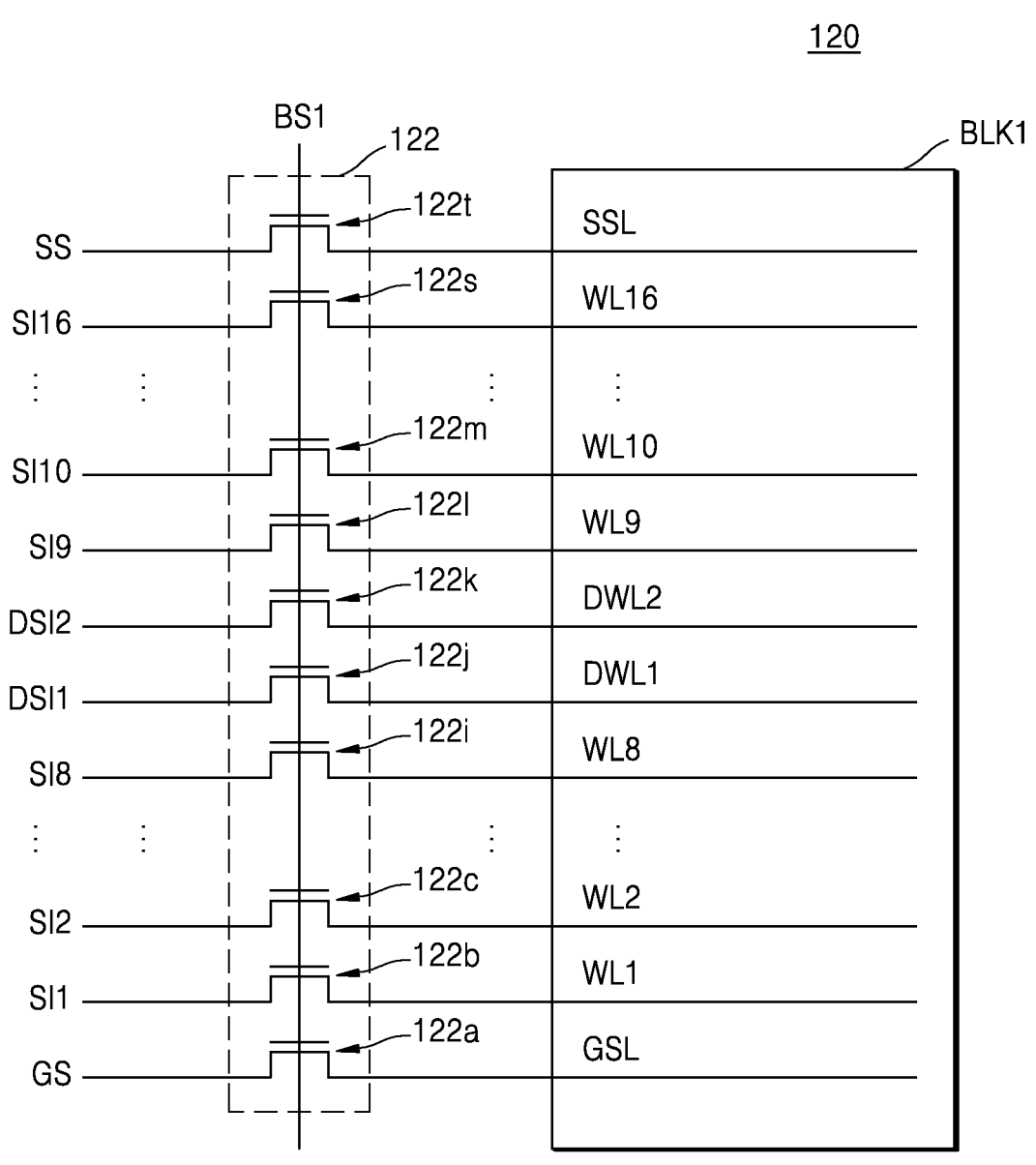
FIG. 7 is a circuit diagram illustrating connections between a pass transistor circuit and a memory block of a memory device, according to an embodiment.

FIG. 7 is a circuit diagram illustrating connections between a pass transistor circuit and a memory block of a memory device, according to an embodiment.

Referring to FIG. 7, a circuit structure of the pass transistor circuit 122 and connections between the driving signal lines and a first memory block BLK1 of the plurality of memory blocks BLK may be identified.

The pass transistor circuit 122 may include a plurality of pass transistors (e.g., first pass transistor 122a to $t^{th}$ pass transistor 122t). The plurality of pass transistors 122a to 122t may be connected to a first block selection signal line (e.g., BS1) through first terminals. For example, the first terminals of the plurality of pass transistors 122a to 122t may be and/or may include gate terminals of the plurality of pass transistors 122a to 122t.

The plurality of pass transistors 122a to 122t may be turned on and/or off based on the block selection voltage VBS applied through the first block selection signal line BS1. For example, the plurality of pass transistors 122a to 122t may be turned on when the block selection voltage VBS applied through the first block selection signal line BS1 is equal to or higher than an activation voltage level, and accordingly, the first memory block BLK1 may be selected. Alternatively or additionally, the plurality of pass transistors 122a to 122t may be turned off when the block selection voltage VBS applied through the first block selection signal line BS1 is less than the activation voltage level, and accordingly, the first memory block BLK1 may not be selected.

As shown in FIG. 7, the pass transistor 122a may connect the ground select line driving signal line GS to the ground select line GSL of the first memory block BLK1. The plurality of pass transistors 122b to 122i may connect the first to eighth word line driving signal lines SI1 to SI8 to the first to eighth word lines WL1 to WL8 of the first memory block BLK1. The plurality of pass transistors 122*j* and 122*k* may connect the first and second dummy word line driving signal lines DSI1 and DSI2 to the first and second dummy word lines DWL1 and DWL2 of the first memory block BLK1. The plurality of pass transistors 122*l* to 122*s* may connect the $9^{th}$ to $16^{th}$ word line driving signal lines SI9 to SI16 to the $9^{th}$ to $16^{th}$ word lines WL1 to WL8 of the first memory block BLK1. The pass transistor 122*t* may connect the string select line driving signal line SS to the string select line SSL of the first memory block BLK1.

The plurality of pass transistors 122*a* to 122*t* may be connected to driving signal lines through second terminals. For example, the second terminals of the plurality of pass transistors 122*a* to 122*t* may be and/or may include source terminals of the plurality of pass transistors 122*a* to 122*t*.

The plurality of pass transistors 122*a* to 122*t* may be connected to the string select line SSL, the plurality of word lines WL, the plurality of dummy word lines DWL, and the ground select line GSL through third terminals of the plurality of pass transistors 122*a* to 122*t*. For example, the third terminals of the plurality of pass transistors 122*a* to 122*t* may be and/or may include drain terminals of the plurality of pass transistors 122*a* to 122*t*.

The plurality of pass transistors 122*a* to 122*t* may be turned on when the block selection voltage VBS applied through the first block selection signal line BS1 is higher than or equal to an activation voltage level, and transfer driving voltages may be applied through driving signal lines to the string select line SSL, the plurality of word lines WL, the plurality of dummy word lines DWL, and the ground select line GSL.

Alternatively or additionally, the plurality of pass transistors 122*a* to 122*t* may be turned off when the block selection voltage VBS applied through the first block selection signal line BS1 is less than the activation voltage level, and may not transfer the driving voltages applied through the driving signal lines to the string select line SSL, the plurality of word lines WL, the plurality of dummy word lines DWL, and the ground select line GSL.

In an embodiment, the pass transistor circuit 122 may be connected to the second to $n^{th}$ memory blocks BLK2 to BLKn in a similar manner as described above, and may include a plurality of pass transistors connected to the second to $n^{th}$ memory blocks BLK2 to BLKn.

Figure 8:
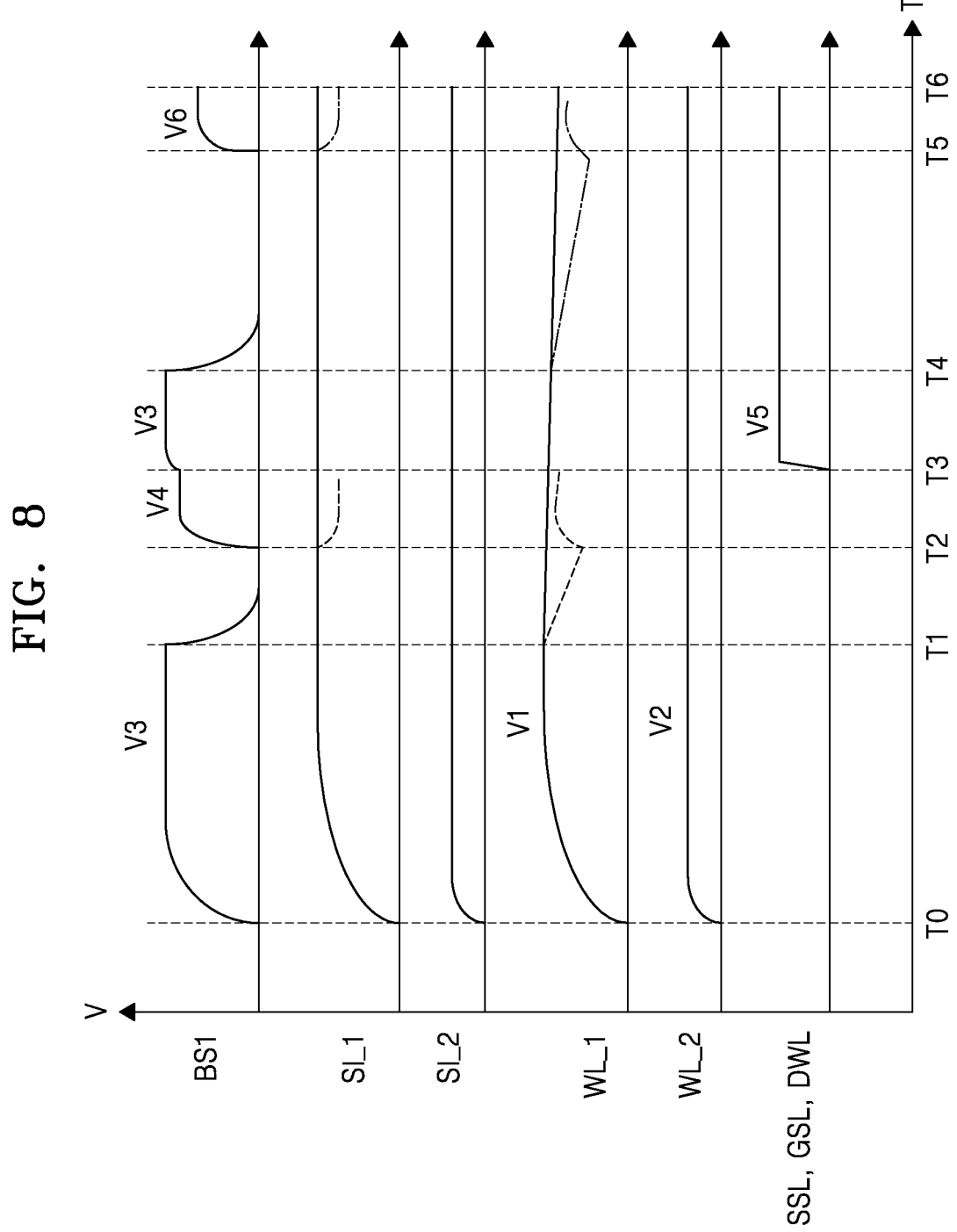
FIG. 8 is a timing diagram illustrating a voltage level change by a control circuit when a memory device performs a leakage detection operation, according to an embodiment.

FIG. 8 is a timing diagram illustrating a voltage level change by a control circuit when a memory device performs a leakage detection operation, according to an embodiment.

Referring to FIG. 8, an example of a timing diagram is illustrated in which, when the memory device 120 performs a leakage detection operation by setting the first memory block BLK1 from among the plurality of memory blocks BLK as a leakage detection target memory block, the control circuit 125 may control voltage levels of the first block selection signal line BS1, a plurality of first detection word line driving signal lines SI_1, a plurality of second detection word line driving signal lines SI_2, a plurality of first detection word lines WL_1, a plurality of second detection word lines WL_2, one or more string select lines SSL, one or more ground select lines GSL, and one or more dummy word lines DWL through the voltage generator 124 and the row decoder 123.

The plurality of first detection word lines WL_1 may include a plurality of word lines on which a leakage detection operation is first performed from among a plurality of word lines included in the first memory block BLK1. Alternatively or additionally, the plurality of second detection word lines WL_2 may include a plurality of word lines on which a leakage detection operation may be subsequently performed from among the plurality of word lines included in the first memory block BLK1.

The plurality of first detection word lines WL_1 may be alternately arranged with the plurality of second detection word lines WL_2. For example, the plurality of first detection word lines WL_1 may include odd-numbered word lines from among the plurality of word lines, and the plurality of second detection word lines WL_2 may include even-numbered word lines from among the plurality of word lines. As shown in FIG. 7, the plurality of first detection word lines WL_1 may include the first word line WL1, a third word line WL3, a fifth word line WL5, a seventh word line WL7, a ninth word line WL9, an eleventh word line WL11, a $13^{th}$ word line WL13, and a $15^{th}$ word line WL15. Alternatively or additionally, the plurality of second detection word lines WL_2 may include the second word line WL2, a fourth word line WL4, a sixth word line WL6, an eighth word line WL8, a tenth word line WL10, a twelfth word line WL12, a $14^{th}$ word line WL14, and a $16^{th}$ word line WL16. However, the present disclosure is not limited thereto, and the plurality of first detection word lines WL_1 may include the even-numbered word lines from among the plurality of word lines, and/or the plurality of second detection word lines WL_2 may include the odd-numbered word lines from among the plurality of word lines.

The plurality of first detection word line driving signal lines SI_1 may include a plurality of word line driving signal lines connected to the same pass transistor to which the plurality of first detection word lines WL_1 are connected, from among the plurality of word line driving signal lines. Alternatively or additionally, the plurality of second detection word line driving signal lines SI_2 may include a plurality of word line driving signal lines connected to the same pass transistor to which the plurality of second detection word lines WL_2 are connected, from among the plurality of word line driving signal lines.

First, from time T0 to time T1, the control circuit 125 may perform a first operation of a leakage detection operation.

In the first operation of the leakage detection operation, the control circuit 125 may apply the block selection voltage VBS of a third voltage level V3 to the first terminals of the plurality of pass transistors connected to a leakage detection target memory block.

The third voltage level V3 may be a voltage level that may turn on a plurality of pass transistors connected to the leakage detection target memory block.

The control circuit 125 may generate the block selection voltage VBS of the third voltage level V3 through the voltage generator 124. The control circuit 125 may apply the generated block selection voltage VBS of the third voltage level V3 to the first block selection signal line BS1 through the row decoder 123. Accordingly, the plurality of pass transistors connected to the first memory block BLK1, which is a leakage detection target memory block, may be turned on.

Alternatively or additionally, in the first operation of the leakage detection operation, the control circuit 125 may set a plurality of word lines included in the leakage detection target memory block.

That is, the control circuit 125 may apply a driving voltage to second terminals of the plurality of pass transistors connected to the plurality of first detection word lines WL_1 so as to set the plurality of first detection word lines WL_1 of the leakage detection target memory block to a first voltage level V1.

The first voltage level V1 may be a voltage level at which leakage may occur in the plurality of first detection word lines WL_1. For example, the first voltage level V1 may be about 6 Volts (V).

The control circuit 125 may generate the word line driving voltage VWL having a voltage level equal to or slightly higher than the first voltage level V1 through the voltage generator 124. The control circuit 125 may apply the word line driving voltage VWL having a voltage level that is substantially similar and/or the same as or slightly higher than the generated first voltage level V1 to the plurality of first detection word line driving signal lines SI_1 connected to the second terminals of the plurality of pass transistors connected to the plurality of first detection word lines WL_1 through the row decoder 123. Since the plurality of pass transistors may be turned on, the word line driving voltage VWL applied to the plurality of first detection word line driving signal lines SI_1 may remain at a substantially similar and/or the same level or may be slightly reduced to become the first voltage level V1 and may be applied to the plurality of first detection word lines WL1.

The control circuit 125 may apply a driving voltage to the second terminals of the plurality of second detection word lines WL_2 so as to set the plurality of second detection word lines WL_2 of the leakage detection target memory block to a second voltage level V2 that is lower than the first voltage level V1.

The second voltage level V2 may be a voltage applied to the plurality of second detection word lines WL_2 so that leakage occurring in the plurality of first detection word lines WL_1 flows to the plurality of second detection word lines WL_2. For example, the second voltage level V2 may be about 2 V, which may be lower than the first voltage level V1.

The control circuit 125 may generate the word line driving voltage VWL having a voltage level equal to or slightly higher than the second voltage level V2 through the voltage generator 124. The control circuit 125 may apply the word line driving voltage VWL having a voltage level that is substantially similar and/or the same as or slightly higher than the generated second voltage level V2 to the plurality of second detection word line driving signal lines SI_2 connected to the second terminals of the plurality of pass transistors connected to the plurality of second detection word lines WL_2 through the row decoder 123. Since the plurality of pass transistors may be turned on, the word line driving voltage VWL applied to the plurality of second detection word line driving signal lines SI_2 may remain at a level that is substantially similar and/or the same or may be slightly reduced to reach the second voltage level V2 and may be applied to the plurality of second detection word lines WL_2.

Alternatively or additionally, in the first operation of the leakage detection operation, the control circuit 125 may apply a driving voltage to the second terminals of the plurality of pass transistors connected to one or more string select lines SSL and one or more ground select lines GSL of the leakage detection target memory block so as to set the one or more string select line SSL and the one or more ground select lines GSL to a cut-off voltage level.

The cut-off voltage level applied to the one or more string select lines SSL and the one or more ground select lines GSL may be a voltage level at which the string select transistor SST connected to the one or more string select lines SSL and the ground select transistor GST connected to the one or more ground select lines GSL may be turned off. The cut-off voltage level applied to the one or more string select lines SSL and the one or more ground select lines GSL may be set to any one of various types of voltage levels, such as a ground voltage level and a VDD voltage level, according to threshold voltage levels of the string select transistor SST and the ground select transistor GST.

The control circuit 125 may generate the string select line driving voltage VSSL and the ground selection line driving voltage VGSL, which have cut-off voltage levels, through the voltage generator 124. The control circuit 125 may apply, through the row decoder 123, the string select line driving voltage VSSL and the ground select line driving voltage VGSL, which have the generated cut-off voltage levels, to the one or more string select line driving signal line SS and the one or more ground select line driving signal lines GS, which may be connected to the second terminals of the plurality of pass transistors connected to the one or more string select lines SSL and the one or more ground select lines GSL. Since the plurality of pass transistors may be turned on, the string select line driving voltage VSSL and the ground select line driving voltage VGSL applied to the one or more string select line driving signal lines SS and the one or more ground select line driving signal lines GS may be applied to the one or more string select lines SSL and the one or more ground select lines GSL.

Alternatively or additionally, in the first operation of the leakage detection operation, the control circuit 125 may apply the driving voltage to the second terminals of the plurality of pass transistors connected to the one or more dummy word lines DWL so as to set the one or more dummy word lines DWL of the leakage detection target memory block to a cut-off voltage level.

The cut-off voltage level applied to the one or more dummy word lines DWL may be a voltage level at which the one or more dummy word lines DWL may be turned off. The cut-off voltage level applied to the one or more dummy word lines DWL may be set to any one of various types of voltage levels, such as a ground voltage level and a VDD voltage level, according to a threshold voltage level of a memory cell connected to the one or more dummy word lines DWL.

The control circuit 125 may generate the dummy word line driving voltage VDWL having the cut-off voltage level through the voltage generator 124. The control circuit 125 may apply, through the row decoder 123, the dummy word line driving voltage VDWL having the generated cut-off voltage level to the one or more dummy word line driving signal lines DSI connected to the second terminals of the plurality of pass transistors connected to the one or more dummy word lines DWL. Since the plurality of pass transistors may be turned on, the dummy word line driving voltage VDWL applied to the one or more dummy word line driving signal lines DSI may be applied to the one or more dummy word lines DWL.

From time T1 to time T2, the control circuit 125 may perform the second operation of the leakage detection operation.

In the second operation of the leakage detection operation, the control circuit 125 may apply the block selection voltage VBS having a cut-off voltage level to the first terminals of the plurality of pass transistors connected to the leakage detection target memory block.

The cut-off voltage level applied to the first terminals of the plurality of pass transistors may be a voltage level at which the plurality of pass transistors may be turned off. The cut-off voltage level applied to the first terminals of the plurality of pass transistors may be set to one of various voltage levels, such as a ground voltage level and a VDD voltage level, according to the threshold voltage levels of the plurality of pass transistors.

The control circuit 125 may generate the block selection voltage VBS having the cut-off voltage level through the voltage generator 124. The control circuit 125 may apply the generated block selection voltage VBS having the cut-off voltage level to a first block selection signal line BS1 through the row decoder 123. Accordingly, the plurality of pass transistors connected to the first memory block BLK1, which is a leakage detection target memory block, may be turned off.

In the second operation of the leakage detection operation, the control circuit 125 may maintain the voltage levels of the plurality of first detection word lines WL_1, the plurality of second detection word lines WL_2, the one or more string select lines SSL, the one or more ground select lines GSL, and the one or more dummy word lines DWL.

From time T2 to time T3, the control circuit 125 may perform the third operation of the leakage detection operation.

In the third operation of the leakage detection operation, the control circuit 125 may apply the block selection voltage VBS of a fourth voltage level, which may be lower than the third voltage level V3, to the first terminals of the plurality of pass transistors connected to the leakage detection target memory block.

The fourth voltage level V4 may be a voltage level at which the plurality of pass transistors connected to the leakage detection target memory block are slightly turned on, and may be a voltage level lower than the third voltage level V3.

The control circuit 125 may generate the block selection voltage VBS of the fourth voltage level V4 through the voltage generator 124. The control circuit 125 may apply the generated block selection voltage VBS of the fourth voltage level V4 to the first block selection signal line BS1 through the row decoder 123. Accordingly, the plurality of pass transistors connected to the first memory block BLK1, which is a leakage detection target memory block, may be slightly turned on.

In the third operation of the leakage detection operation, the control circuit 125 may detect leakage in the first direction in the plurality of first detection word lines WL_1. When the leakage in the first direction occurs, the voltage levels of the plurality of first detection word lines WL_1 and/or the voltage levels of the plurality of first detection word line driving signal lines SI_1 may decrease, as indicated by a dotted line of the timing diagram of FIG. 8. When the voltage levels of the plurality of first detection word lines WL_1 and/or the voltage levels of the plurality of first detection word line driving signal lines SI_1 decrease in a period from time T2 to time T3, the control circuit 125 may determine that leakage in the first direction is detected in the plurality of first detection word lines WL_1 of the leakage detection target memory block.

When leakage in the first direction is detected in the leakage detection target memory block in the third operation of the leakage detection operation, the control circuit 125 may terminate the leakage detection operation. When leakage is detected in at least one of the plurality of word lines included in the leakage detection target memory block, the control circuit 125 may prevent use of the leakage detection target memory block. Accordingly, when the leakage in the first direction is detected in the leakage detection target memory block in the third operation of the leakage detection operation, the control circuit 125 may not perform an additional leakage detection operation.

Conversely, in the third operation of the leakage detection operation, when leakage in the first direction is not detected, the process may enter the fourth operation of the leakage detection operation, so that the leakage detection operation may be continued, as in the graph shown after time T3 of the timing diagram of FIG. 8.

From time T3 to time T4, the control circuit 125 may perform the fourth operation of the leakage detection operation.

In the fourth operation of the leakage detection operation, the control circuit 125 may apply the block selection voltage VBS of the third voltage level V3 to the first terminals of the plurality of pass transistors connected to the leakage detection target memory block.

Alternatively or additionally, in the fourth operation of the leakage detection operation, the control circuit 125 may apply the driving voltage to the second terminals of the plurality of pass transistors connected to the one or more string select lines SSL and the one or more ground select lines GSL of the leakage detection target memory block so as to set the one or more string select lines SSL and the one or more ground select lines GSL to a fifth voltage level V5.

The fifth voltage level V5 may be a voltage level that completes turns on the string select transistor SST connected to the one or more string select lines SSL and the ground select transistor GST connected to the one or more ground select lines GSL.

The control circuit 125 may generate the string select line driving voltage VSSL and the ground select line driving voltage VGSL, which may have the fifth voltage levels V5, through the voltage generator 124. The control circuit 125 may apply, through the row decoder 123, the string select line driving voltage VSSL and the ground select line driving voltage VGSL each having the generated fifth voltage level V5 to the one or more string select line driving signal lines SS and the one or more ground select line driving signal lines GS, which may be connected to the second terminals of the plurality of pass transistors connected to the one or more string select lines SSL and the one or more ground select lines GSL. Since the plurality of pass transistors are turned on, the string select line driving voltage VSSL and the ground select line driving voltage VGSL applied to the one or more string select line driving signal lines SS and the one or more ground select line driving signal lines GS may be applied to the one or more string select lines SSL and the one or more ground select lines GSL.

Alternatively or additionally, in the fourth operation of the leakage detection operation, the control circuit 125 may apply the driving voltage to the second terminals of the plurality of pass transistors connected to the one or more dummy word lines DWL so as to set the one or more dummy word lines DWL of the leakage detection target memory block to the fifth voltage level V5.

The control circuit 125 may generate the dummy word line driving voltage VDWL having the fifth voltage level V5 through the voltage generator 124. The control circuit 125 may apply, through the row decoder 123, the generated dummy word line driving voltage VDWL having the fifth voltage level V5 to the one or more dummy word line driving signal lines DSI connected to the second terminals of the plurality of pass transistors connected to the one or more dummy word lines DWL. Since the plurality of pass transistors are turned on, the dummy word line driving voltage VDWL applied to the one or more dummy word line driving signal lines DSI may be applied to the one or more dummy word lines DWL.

From time T4 to time T5, the control circuit 125 may perform the fifth operation of the leakage detection operation.

In the fifth operation of the leakage detection operation, the control circuit 125 may apply the block selection voltage VBS of the cut-off voltage level to the first terminals of the plurality of pass transistors connected to the leakage detection target memory block. The control circuit 125 may turn off the plurality of pass transistors connected to the first memory block BLK1, which is a leakage detection target memory block, in a similar manner as in the second operation of the leakage detection operation.

In the fifth operation of the leakage detection operation, the control circuit 125 may maintain voltage levels of the plurality of first detection word lines WL_1, the plurality of second detection word lines WL_2, the one or more string select lines SSL, the one or more ground select lines GSL, and the one or more dummy word lines DWL.

From time T5 to time T6, the control circuit 125 may perform the sixth operation of the leakage detection operation.

In the sixth operation of the leakage detection operation, the control circuit 125 may apply the block selection voltage VBS of a sixth voltage level V6, which may be lower than the fourth voltage level, to the first terminals of the plurality of pass transistors connected to the leakage detection target memory block.

The sixth voltage level V6 may be a voltage level at which the plurality of pass transistors connected to the leakage detection target memory block may be slightly turned on. Since a time from time T1 to time T2 may be shorter than a time from time T4 to time T5, the sixth voltage level V6 may be a lower voltage level than the fourth voltage level V4.

The control circuit 125 may generate the block selection voltage VBS of the sixth voltage level V6 through the voltage generator 124. The control circuit 125 may apply the generated block selection voltage VBS of the sixth voltage level V6 to the first block selection signal line BS1 through the row decoder 123. Accordingly, the plurality of pass transistors connected to the first memory block BLK1, which is a leakage detection target memory block, may be slightly turned on.

In the sixth operation of the leakage detection operation, the control circuit 125 may detect leakage in the second direction in the plurality of first detection word lines WL_1. When leakage in the second direction occurs, voltage levels of the plurality of first detection word lines WL_1 and/or voltage levels of the plurality of first detection word line driving signal lines SI_1 may decrease, as indicated by a dotted line in the timing diagram of FIG. 8. When the voltage levels of the plurality of first detection word lines WL1 and/or the voltage levels of the plurality of first detection word line driving signal lines SI_1 decrease during a period between time T5 and time T6, the control circuit 125 may determine that leakage in the second direction is detected in the plurality of first detection word lines WL_1 of the leakage detection target memory block.

When leakage in the second direction is detected in the leakage detection target memory block in the sixth operation of the leakage detection operation, the control circuit 125 may terminate the leakage detection operation.

Alternatively or additionally, when leakage in the second direction is not detected in the leakage detection target memory block in the sixth operation of the leakage detection operation, the process may re-enter the first operation of the leakage detection operation.

In the re-entered first operation of the leakage detection operation, the control circuit 125 may control the voltage levels of the plurality of first detection word lines WL_1 and the plurality of second detection word lines WL_2 conversely with the first operation the leakage detection operation before the re-entry. That is, in the re-entered first operation of the leakage detection operation, the control circuit 125 may apply the driving voltage to the second terminals of the plurality of pass transistors connected to the plurality of first detection word lines WL_1 so as to set the plurality of first detection word lines WL_1 of the leakage detection target memory block to the second voltage level V2, and apply the driving voltage to the second terminals of the plurality of pass transistors connected to the plurality of second detection word lines WL_2 so as to set the plurality of second detection word lines WL_2 of the leakage detection target memory block to the first voltage level V1.

Consequently, the control circuit 125 may detect leakages in the first direction and the second direction in the plurality of second detection word lines WL_2 by repeating the second to sixth operations of the leakage detection operation.

When the memory device 120 of the present disclosure as described above is used, by setting the plurality of first detection word lines WL_1 to the first voltage level V1 and setting the plurality of second detection word lines WL_2 to the second voltage level V2, leakage occurring in the plurality of word lines may be detected more quickly. Alternatively or additionally, both leakage in the first direction and leakage in the second direction may be detected by setting voltage levels of the one or more string select lines SSL and the one or more ground select lines GSL to a preset voltage level.

Figure 9:
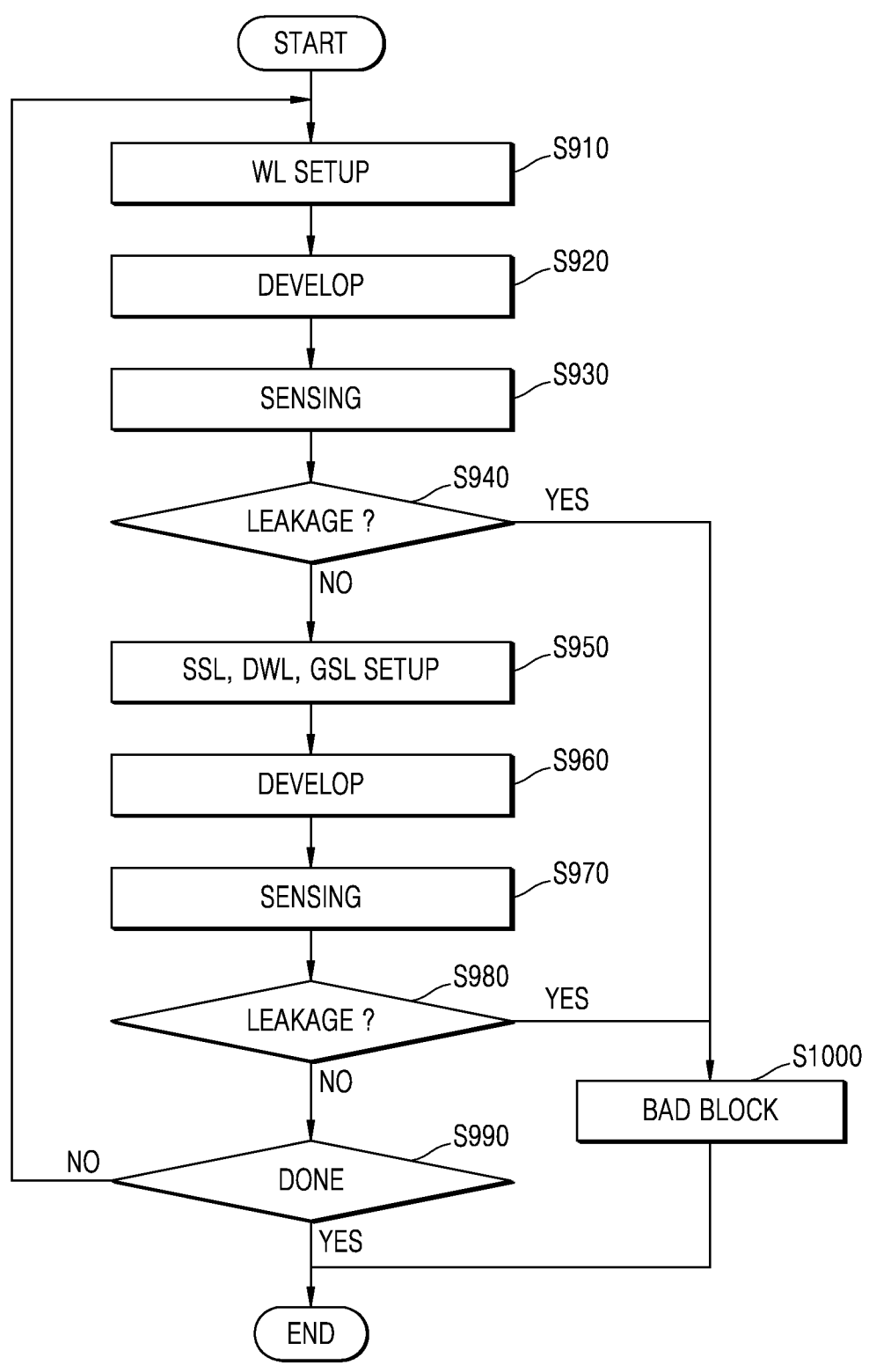
FIG. 9 is a flowchart of a leakage detection operation process of a memory device, according to an embodiment.

FIG. 9 is a flowchart of a leakage detection operation process of a memory device, according to an embodiment.

Referring to FIG. 9, in operation S910, the memory device 120 may perform a word line setup operation. The word line setup operation may refer to an operation corresponding to the first operation of the leakage detection operation from time T0 to time T1 as described with reference to FIG. 8.

Through the word line setup operation, the plurality of first detection word lines WL_1 may be set to the first voltage level V1, the plurality of second detection word lines WL_2 may be set to the second voltage level V2, and the first block selection signal line BS1 may be set to the third voltage level V3. Alternatively or additionally, the one or more string select lines SSL, the one or more dummy word lines DWL, and the one or more ground select lines GSL may be set to a cut-off voltage level.

In operation S920, the memory device 120 may perform a development operation. The development operation may refer to an operation corresponding to the second operation of the leakage detection operation from time T1 to time T2 as described with reference to FIG. 8.

Through the development operation, the first block selection signal line BS1 may be set to the cut-off voltage level.

In operation S930, the memory device 120 may perform a sensing operation. The sensing operation may refer to an operation corresponding to the third operation of the leakage detection operation from time T2 to time T3 as described with reference to FIG. 8.

Through the sensing operation, the first block selection signal line BS1 may be set to the fourth voltage level V4.

In operation S940, the memory device 120 may determine whether leakage in the first direction is detected in the plurality of first detection word lines WL_1.

When it is determined that leakage in the first direction is detected (Yes in operation S940), the process may proceed to operation S1000, and the memory device 120 may set the leakage detection target memory block as a bad block.

When it is determined that leakage in the first direction is not detected (No in operation S940), the process may proceed to operation S950, and the memory device 120 may perform setup operations for a string select line, a ground select line, and a dummy word line. The setup operations for the string select line, the dummy word line, and the ground select line may refer to operations corresponding to the fourth operation of the leakage detection operation from time T3 to time T4 as described with reference to FIG. 8.

Through the setup operations for string select line, the dummy word line, and the ground select line, the one or more string select lines SSL, the one or more dummy word lines DWL, and the one or more ground select lines GSL may be set to the fifth voltage level V5.

In operation S960, the memory device 120 may perform a development operation. The development operation of operation S960 may refer to an operation corresponding to the fifth operation of the leakage detection operation from time T4 to time T5 as described with reference to FIG. 8.

Through the development operation, the first block selection signal line BS1 may be set to the cut-off voltage level.

In operation S970, the memory device 120 may perform a sensing operation. The sensing operation of operation S970 may refer to an operation corresponding to the sixth operation of the leakage detection operation from time T5 to time T6 as described with reference to FIG. 8.

Through the sensing operation, the first block selection signal line BS1 may be set to the sixth voltage level V6.

In operation S980, the memory device 120 may determine whether leakage in the second direction is detected in the plurality of first detection word lines WL_1.

When it is determined that leakage in the second direction is detected (Yes in operation S980), the process may proceed to operation S1000, and the memory device 120 may set the leakage detection target memory block as a bad block, in operation S1000.

When it is determined that the leakage in the second direction is not detected (No in operation S980), the process may proceed to operation S990, and the memory device 120 may determine whether the leakage detection operation has been performed on the plurality of word lines included in the leakage detection target memory block.

When the leakage detection operations for the plurality of first detection word lines WL_1 and the plurality of second detection word lines WL_2 has been completed (Yes in operation S990), the memory device 120 may determine that the leakage detection operation has been performed for the plurality of word lines included in the leakage detection target memory block, and terminate the leakage detection operation.

When only the leakage detection operation for the plurality of first detection word lines WL_1 has been completed and the leakage detection operation for the plurality of second detection word lines WL_2 has not been completed (No in operation S990), the memory device 120 may determine that the leakage detection operation has not been performed for the plurality of word lines included in the leakage detection target memory block, and the process may re-enter operation S910.

In the re-entered operation S910, the memory device 120 may control the voltage levels of the plurality of first detection word lines WL_1 and the plurality of second detection word lines WL_2 opposite to operation S910 before re-entry. Alternatively or additionally, operations S920 to S980 may be performed, and the leakage detection operation for the plurality of second detection word lines WL_2 may be performed.

Figure 10:
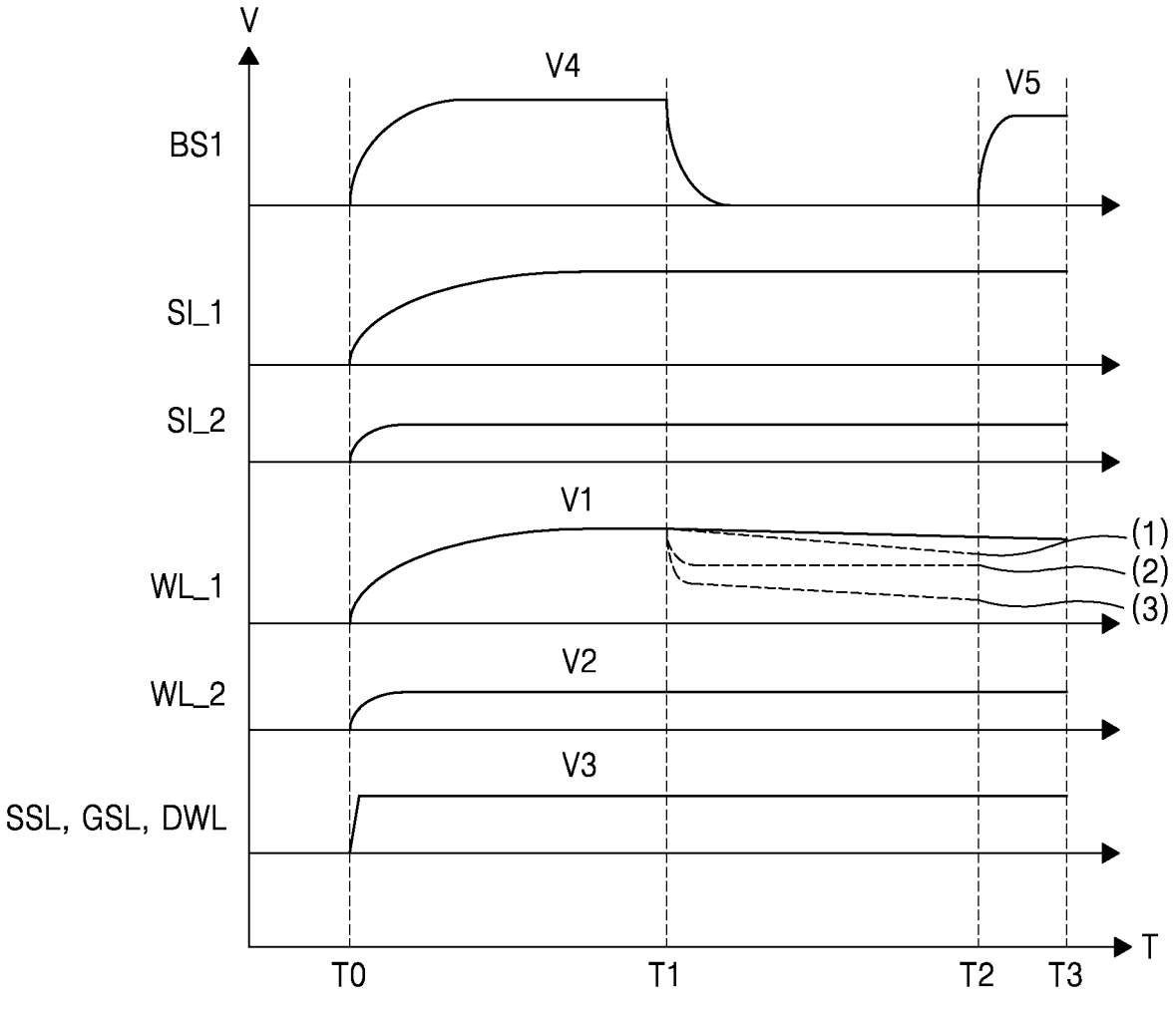
FIG. 10 is a timing diagram illustrating a voltage level change by a control circuit when a memory device performs a leakage detection operation, according to an embodiment.

FIG. 10 is a timing diagram illustrating a voltage level change by a control circuit when a memory device performs a leakage detection operation, according to an embodiment.

Referring to FIG. 10, another example of a timing diagram may be identified in which, when the memory device 120 performs a leakage detection operation by setting the first memory block BLK1 from among the plurality of memory blocks BLK as a leakage detection target memory block, the control circuit 125 controls, through the voltage generator 124 and the row decoder 123, the voltage levels of the first block selection signal line BS1, the plurality of first detection word line driving signal lines SI_1, the plurality of second detection word line driving signal lines SI_2, the plurality of first detection word lines WL_1, the plurality of second detection word lines WL_2, the one or more string select lines SSL, the one or more ground select line GSL, and the one or more dummy word line DWL.

In an embodiment, the first voltage level V1 and the second voltage level V2, as shown in FIG. 10, may be substantially similar and/or the same voltage levels as the first voltage level V1 and the second voltage level V2 shown in FIG. 8. Alternatively or additionally, the third voltage level V3 to the fifth voltage level V5 shown in FIG. 10 may be different from the third voltage level V3 to the fifth voltage level V5 shown in FIG. 8, respectively.

In an embodiment, the control circuit 125 may perform a first operation of a leakage detection operation from time T0 to time T1.

In the first operation of the leakage detection operation, the control circuit 125 may apply the block selection voltage VBS of the fourth voltage level V4 to the first terminals of the plurality of pass transistors connected to the leakage detection target memory block.

The fourth voltage level V4 may be a voltage level at which the plurality of pass transistors connected to the leakage detection target memory block may be turned on.

The control circuit 125 may generate the block selection voltage VBS of the fourth voltage level V4 through the voltage generator 124. The control circuit 125 may apply the generated block selection voltage VBS of the fourth voltage level V4 to the first block selection signal line BS1 through the row decoder 123. Accordingly, the plurality of pass transistors connected to the first memory block BLK1, which may be a leakage detection target memory block, may be turned on.

Alternatively or additionally, in the first operation of the leakage detection operation, the control circuit 125 may setup a plurality of word lines included in the leakage detection target memory block.

That is, the control circuit 125 may apply the driving voltage to the second terminals of the plurality of pass transistors connected to the plurality of first detection word lines WL_1 so as to set the plurality of first detection word lines WL_1 of the leakage detection target memory block to the first voltage level V1.

Alternatively or additionally, the control circuit 125 may apply the driving voltage to the second terminals of the plurality of pass transistors connected to the plurality of second detection word lines WL_2 so as to set the plurality of second detection word lines WL_2 of the leakage detection target memory block to the second voltage level V2 that is lower than the first voltage level V1.

Alternatively or additionally, in the first operation of the leakage detection operation, the control circuit 125 may apply the driving voltage to the second terminals of the plurality of pass transistors connected to the one or more string select lines SSL and the one or more ground select lines GSL of the leakage detection target memory block so as to set the one or more string select lines SSL and the one or more ground select lines GSL to the third voltage level V3.

The third voltage level V3 may be a voltage level at which the string select transistor SST connected to the one or more string select lines SSL and the ground select transistor GST connected to the one or more ground select lines GSL may be turned on.

The control circuit 125 may generate the string select line driving voltage VSSL and the ground select line driving voltage VGSL, which may have the third voltage level V3, through the voltage generator 124. The control circuit 125 may apply, through the row decoder 123, the generated string select line driving voltage VSSL and the generated ground select line driving voltage VGSL each having the third voltage level V3, to the one or more string select line driving signal lines SS and the one or more ground select line driving signal lines GS, which may be connected to the second terminals of the plurality of pass transistors connected to the one or more string select lines SSL and the one or more ground select lines GSL. Since the plurality of pass transistors may be turned on, the string select line driving voltage VSSL and the ground select line driving voltage VGSL, which may be applied to the one or more string select line driving signal lines SS and the one or more ground select line driving signal lines GS, may be applied to the one or more string select lines SSL and the one or more ground select lines GSL.

Alternatively or additionally, in the first operation of the leakage detection operation, the control circuit 125 may apply the driving voltage to the second terminals of the plurality of pass transistors connected the one or more dummy word lines DWL of the leakage detection target memory block so as to set the one or more dummy word lines DWL to the third voltage level V3.

The control circuit 125 may generate the dummy word line driving voltage VDWL having the third voltage level V3 through the voltage generator 124. The control circuit 125 may apply, through the row decoder 123, the generated dummy word line driving voltage VDWL having the third voltage level V3 to the one or more dummy word line driving signal lines DSI connected to the second terminals of the plurality of pass transistors connected to the one or more dummy word lines DWL. Since the plurality of pass transistors may be turned on, the dummy word line driving voltage VDWL applied to the one or more dummy word line driving signal lines DSI may be applied to the one or more dummy word lines DWL.

From time T1 to time T2, the control circuit 125 may perform the second operation of the leakage detection operation.

In the second operation of the leakage detection operation, the control circuit 125 may apply the block selection voltage VBS having the cut-off voltage level to the first terminals of the plurality of pass transistors connected to the leakage detection target memory block.

The control circuit 125 may generate the block selection voltage VBS having the cut-off voltage level through the voltage generator 124. The control circuit 125 may apply the generated block selection voltage VBS having the cut-off voltage level to the first block selection signal line BS1 through the row decoder 123. Accordingly, the plurality of pass transistors connected to the first memory block BLK1, which may be a leakage detection target memory block, may be turned off.

In the second operation of the leakage detection operation, the control circuit 125 may maintain the voltage levels of the plurality of first detection word lines WL_1, the plurality of second detection word lines WL_2, the one or more string select lines SSL, the one or more ground select lines GSL, and the one or more dummy word lines DWL as they are.

From time T2 to time T3, the control circuit 125 may perform the third operation of the leakage detection operation.

In the third operation of the leakage detection operation, the control circuit 125 may apply the block selection voltage VBS having the fifth voltage level V5, which may be lower than the fourth voltage level V4, to the first terminals of the plurality of pass transistors connected to the leakage detection target memory block.

The fifth voltage level V5 may be a voltage level at which the plurality of pass transistors connected to the leakage detection target memory block may be slightly turned on. Alternatively or additionally, the fifth voltage level V5 may be lower than the fourth voltage level V4.

The control circuit 125 may generate the block selection voltage VBS of the fifth voltage level V5 through the voltage generator 124. The control circuit 125 may apply the generated block selection voltage VBS of the fifth voltage level V5 to the first block selection signal line BS1 through the row decoder 123. Accordingly, the plurality of pass transistors connected to the first memory block BLK1, which may be a leakage detection target memory block, may be slightly turned on.

In the third operation of the leakage detection operation, the control circuit 125 may detect leakage in the first direction and leakage in the second direction in the plurality of first detection word lines WL_1. That is, when leakage occurs in the first direction, the voltage level of the plurality of first detection word lines WL_1 may decrease as indicated by the dotted line (2) in the timing diagram of FIG. 10. Alternatively or additionally, when leakage occurs in the second direction, the voltage level of the plurality of first detection word lines WL_1 may decrease as indicated by the dotted line (1) in the timing diagram of FIG. 10. For another example, when leakage in the first direction and leakage in the second direction both occur, the voltage levels of the plurality of first detection word lines WL_1 may decrease as indicated by the dotted line (3) in the timing diagram of FIG. 10

When the voltage levels of the plurality of first detection word lines WL_1 decrease in the period between time T2 and time T3, the control circuit 125 may determine that leakage in the first direction or leakage in the second direction is detected in the plurality of first detection word lines WL_1 of the leakage detection target memory block.

When leakage in the first direction or leakage in the second direction is detected in the leakage detection target memory block, the control circuit 125 may terminate the leakage detection operation, in the third operation of the leakage detection operation.

Alternatively or additionally, when leakage in the first direction and leakage in the second direction are not detected in the leakage detection target memory block, the first operation of the leakage detection operation may be re-entered, in the third operation of the leakage detection operation.

In the re-entered first operation of the leakage detection operation, the control circuit 125 may control the voltage levels of the plurality of first detection word lines WL_1 and the plurality of second detection word lines WL_2 opposite to the first operation of the leakage detection operation before re-entry. That is, in the re-entered first operation of the leakage detection operation, the control circuit 125 may apply the driving voltage to the second terminals of the plurality of pass transistors connected to the plurality of first detection word lines WL_1 so as to set the plurality of first detection word lines WL_1 of the leakage detection target memory block to the second voltage level V2, and apply the driving voltage to the second terminals of the plurality of pass transistors connected to the plurality of second detection word lines WL_2 so as to set the plurality of second detection word lines WL_2 of the leakage detection target memory block to the first voltage level V1.

Consequently, the control circuit 125 may detect leakage in the first direction and leakage in the second direction in the plurality of second detection word lines WL_2 by repeating the second and third operations of the leakage detection operation.

As described above, when the memory device 120, according to an embodiment of FIG. 10 is used, leakage in the first direction and leakage in the second direction may be simultaneously detected through a single setup operation.

Figure 11:
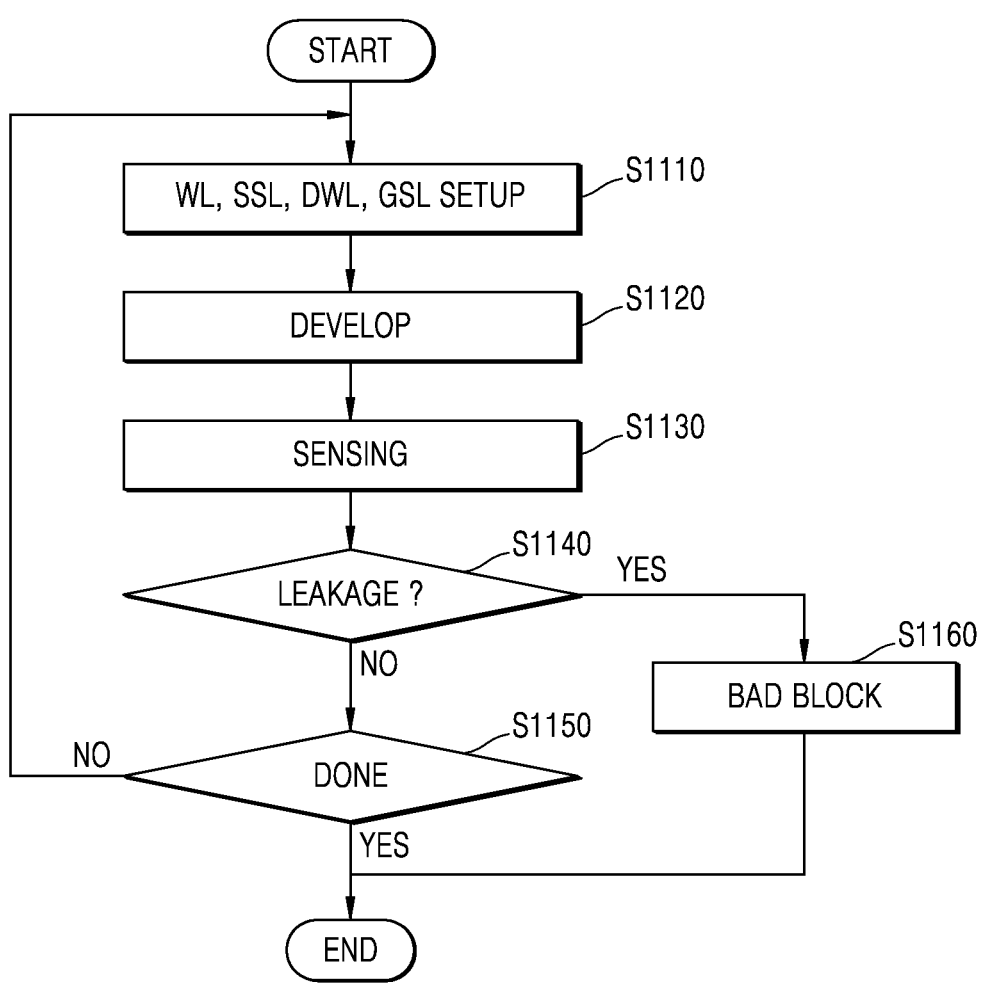
FIG. 11 is a flowchart of a leakage detection operation process of a memory device, according to an embodiment.

FIG. 11 is a flowchart of a leakage detection operation process of a memory device, according to an embodiment.

Referring to FIG. 11, in operation S1110, the memory device 120 may perform a word line setup operation. Setup operations for the word line, the string selection line, the ground select line, and the dummy word line may correspond to operations corresponding to the first operation of the leakage detection operation from time T0 to time T1 as described with reference to FIG. 10.

Through the setup operations for the word line, the string select line, the ground select line, and the dummy word line, the plurality of first detection word lines WL_1 may be set to the first voltage level V1, the plurality of second detection word lines WL_2 may be set to the second voltage level V2, and the first block selection signal line BS1 may be set to the fourth voltage level V4. Alternatively or additionally, the one or more string select lines SSL, the one or more dummy word lines DWL, and the one or more ground select lines GSL may be set to the third voltage level V3.

In operation S1120, the memory device 120 may perform a development operation. The development operation may refer to an operation corresponding to the second operation of the leakage detection operation from time T1 to time T2 as described with reference to FIG. 10.

Through the development operation, the first block selection signal line BS1 may be set to the cut-off voltage level.

In operation S1130, the memory device 120 may perform a sensing operation. The sensing operation may refer to an operation corresponding to the third operation of the leakage detection operation from time T2 to time T3 as described with reference to FIG. 10.

Through the sensing operation, the first block selection signal line BS1 may be set to the fifth voltage level V5.

In operation S1140, the memory device 120 may determine whether leakage in the first direction or leakage in the second direction is detected in the plurality of first detection word lines WL_1.

When it is determined that leakage in the first direction or leakage in the second direction is detected (Yes at operation S1140), the memory device 120 may set the leakage detection target memory block as a bad block, in operation S1160.

When it is determined that leakage in the first direction or leakage in the second direction is not detected (No at operation S1140), the process may proceed to operation S1150, and the memory device 120 may determine whether the leakage detection operation has been performed for the plurality of word lines included in the leakage detection target memory block.

When the leakage detection operations for the plurality of first detection word lines WL_1 and the plurality of second detection word lines WL_2 have been completed, the memory device 120 may determine that the leakage detection operation is performed for the plurality of word lines included in the leakage detection target memory block (Yes in operation S1150), and terminate the leakage detection operation.

When only the leakage detection operation for the plurality of first detection word lines WL_1 has been completed and the leakage detection operation for the plurality of second detection word lines WL_2 has not been completed, the memory device 120 may determine that the leakage detection operation has not been performed for the plurality of word lines included in the leakage detection target memory block (No in operation S1150), and re-enter operation S1110.

In the re-entered operation S1110, the memory device 120 may control the voltage levels of the plurality of first detection word lines WL_1 and the plurality of second detection word lines WL_2 opposite to operation S1110 before re-entry. Alternatively or additionally, operations S1120 to S1140 may be performed, and the leakage detection operation for the plurality of second detection word lines WL_2 may be performed.

Figure 12:
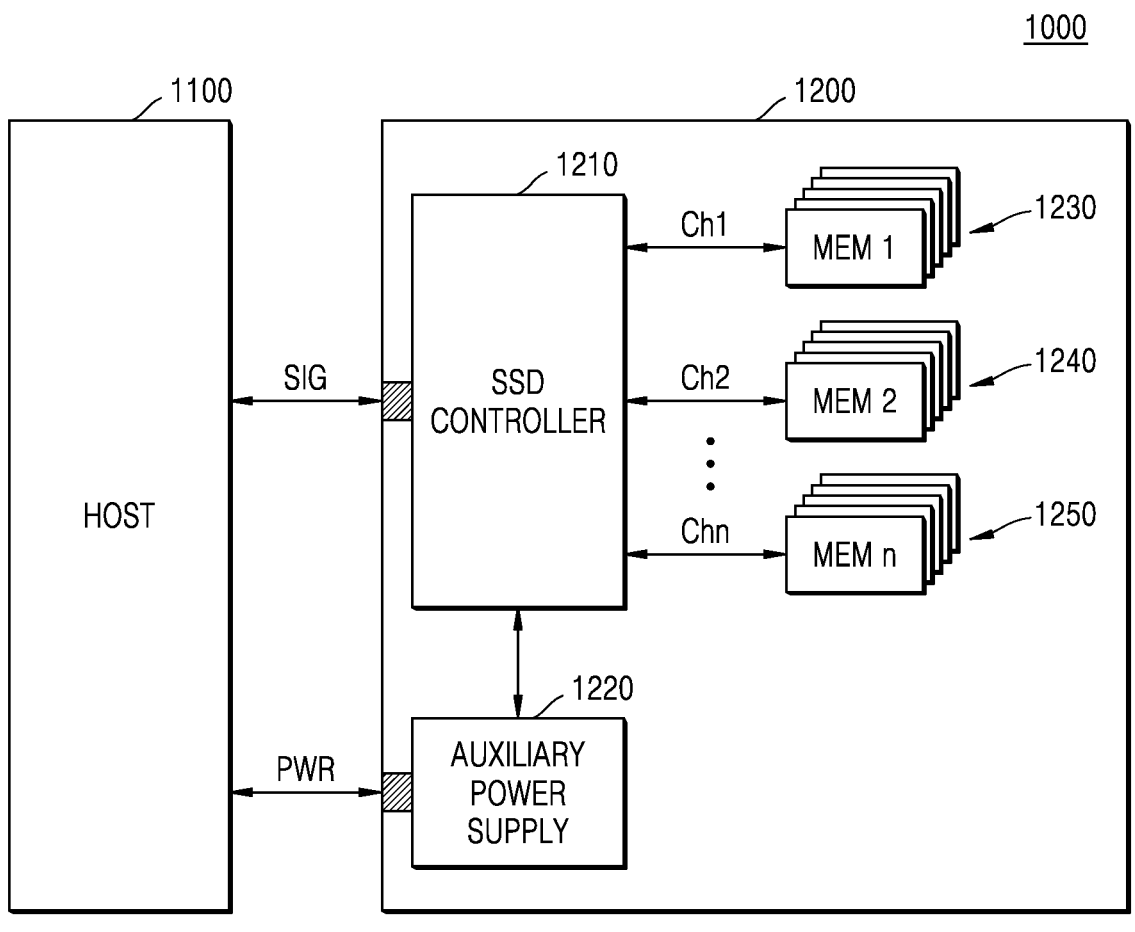
FIG. 12 is a block diagram of an example of applying a memory device to a solid-state drive (SSD) system, according to an embodiment.

FIG. 12 is a block diagram illustrating an example of applying a memory device to a solid state drive (SSD) system 1000, according to embodiments.

Referring to FIG. 12, the SSD system 1000 may include a host 1100 and an SSD 1200. The SSD 1200 may exchange signals with the host 1100 through a signal connector and/or receive power through a power connector. The SSD 1200 may include an SSD controller 1210, an auxiliary power device 1220, and memory devices (e.g., first memory device MEM1 1230, second memory device MEM2 1240, to $n^{th}$ memory device MEMn 1250, hereinafter generally referred to as "MEM"). In an embodiment, the memory devices MEM may be vertically stacked NAND flash memory devices. In such an embodiment, the SSD 1200 may be implemented by using at least similar embodiments to those described with reference to FIGS. 1 to 11.

While the present disclosure has been particularly shown and described with reference to embodiments thereof, it may be understood that various changes in form and details may be made therein without departing from the spirit and scope of the following claims.

What is claimed is:

1. A memory device, comprising:
a memory cell array comprising a plurality of memory blocks, the plurality of memory blocks comprising a plurality of word lines;
a pass transistor circuit comprising a plurality of pass transistors coupled to the plurality of word lines;
a row decoder configured to provide a block selection voltage to first terminals of the plurality of pass transistors and provide a driving voltage to second terminals of the plurality of pass transistors;

a voltage generator configured to generate the block selection voltage and the driving voltage; and a control circuit configured to control the row decoder and the voltage generator and perform a leakage detection operation on the plurality of memory blocks, wherein the control circuit is further configured, when the leakage detection operation is performed on a target memory block from among the plurality of memory blocks, to:

set a plurality of first detection word lines from among the plurality of word lines of the target memory block to a first voltage level by applying the driving voltage to a first plurality of second terminals of the plurality of pass transistors coupled to the plurality of first detection word lines of the target memory block; and set a plurality of second detection word lines from among the plurality of word lines of the target memory block to a second voltage level by applying the driving voltage to a second plurality of second terminals of the plurality of pass transistors coupled to the plurality of second detection word lines of the target memory block, the second voltage level being lower than the first voltage level, and wherein the control circuit is further configured to:

set up, in a first operation of the leakage detection operation, the plurality of word lines of the target memory block by applying a first block selection voltage to a plurality of first terminals of the plurality of pass transistors coupled to the target memory block, the first block selection voltage having a third voltage level;

apply, in a second operation of the leakage detection operation, a second block selection voltage to the plurality of first terminals of the plurality of pass transistors coupled to the target memory block, the second block selection voltage having a cut-off voltage level; and apply, in a third operation of the leakage detection operation, a third block selection voltage to the plurality of first terminals of the plurality of pass transistors coupled to the target memory block, the third block selection voltage having a fourth voltage level, the fourth voltage level being lower than the third voltage level.

2. The memory device of claim 1, wherein the plurality of first detection word lines are alternately arranged with the plurality of second detection word lines.

3. The memory device of claim 1, wherein the control circuit is further configured to:

terminate the leakage detection operation based on leakage being detected in a first direction in the target memory block, when the third operation of the leakage detection operation is performed.

4. The memory device of claim 1, wherein:

the plurality of memory blocks further comprise one or more string select lines and one or more ground select lines, the plurality of pass transistors are coupled to the one or more string select lines and the one or more ground select lines, and the control circuit is further configured to set, in the first operation of the leakage detection operation, the one or more string select lines and the one or more ground select lines to the cut-off voltage level by applying the driving voltage to a third plurality of second terminals of the plurality of pass transistors coupled to the one or more string select lines and the one or more ground select lines of the target memory block.

5. The memory device of claim 4, wherein the control circuit is further configured to:

enter a fourth operation of the leakage detection operation based on leakage not being detected in a first direction in the target memory block, when the third operation of the leakage detection operation is performed;

apply, in the fourth operation of the leakage detection operation, the first block selection voltage to the plurality of first terminals of the plurality of pass transistors coupled to the target memory block; and set, in the fourth operation of the leakage detection operation, the one or more string select lines and the one or more ground select lines to a fifth voltage level by applying the driving voltage to the third plurality of second terminals of the plurality of pass transistors coupled to the one or more string select lines and the one or more ground select lines of the target memory block.

6. The memory device of claim 5, wherein the control circuit is further configured to:

apply, in a fifth operation of the leakage detection operation, the second block selection voltage to the plurality of first terminals of the plurality of pass transistors coupled to the target memory block; and apply, in a sixth operation of the leakage detection operation, apply a fourth block selection voltage to the plurality of first terminals of the plurality of pass transistors coupled to the target memory block, the fourth block selection voltage having a sixth voltage level, the sixth voltage level being lower than the fourth voltage level.

7. The memory device of claim 6, wherein the control circuit is further configured to:

terminate the leakage detection operation based on leakage being detected in a second direction in the target memory block, when the sixth operation of the leakage detection operation is performed.

8. The memory device of claim 6, wherein the control circuit is further configured to:

re-enter the first operation of the leakage detection operation based on leakage not being detected in a second direction in the target memory block, when the sixth operation of the leakage detection operation is performed;

set, in the re-entered first operation of the leakage detection operation, the plurality of first detection word lines to the second voltage level by applying the driving voltage to the first plurality of second terminals of the plurality of pass transistors coupled to the plurality of first detection word lines; and set, in the re-entered first operation of the leakage detection operation, the plurality of second detection word lines to the first voltage level by applying the driving voltage to the second plurality of second terminals of the plurality of pass transistors coupled to the plurality of second detection word lines.

9. The memory device of claim 1, wherein:

the plurality of memory blocks further comprise one or more dummy word lines, the plurality of pass transistors are coupled to the one or more dummy word lines, and the control circuit is further configured to set, in the first operation of the leakage detection operation, the one or more dummy word lines to the cut-off voltage level by applying the driving voltage to a fourth plurality of second terminals of the plurality of pass transistors coupled to the one or more dummy word lines of the target memory block.

10. The memory device of claim 9, wherein the control circuit is further configured to:

enter a fourth operation of the leakage detection operation based on leakage not being detected in a first direction in the target memory block, when the third operation of the leakage detection operation is performed; and set, in the fourth operation of the leakage detection operation, the one or more dummy word lines to a fifth voltage level by applying the driving voltage to the fourth plurality of second terminals of the plurality of pass transistors coupled to the one or more dummy word lines of the target memory block.

11. A memory device comprising:

a memory cell array comprising a plurality of memory blocks, the plurality of memory blocks comprising a plurality of word lines, one or more string select lines, and one or more ground select lines;

a pass transistor circuit comprising a plurality of pass transistors coupled to the plurality of memory blocks through the plurality of word lines, the one or more string select lines, and the one or more ground select lines;

a row decoder configured to provide a block selection voltage to first terminals of the plurality of pass transistors and provide a driving voltage to second terminals of the plurality of pass transistors;

a voltage generator configured to generate the block selection voltage and the driving voltage; and a control circuit configured to control the row decoder and the voltage generator and perform a leakage detection operation on the plurality of memory blocks, wherein the control circuit is further configured, when the leakage detection operation is performed on a target memory block from among the plurality of memory blocks, to:

set, in a first operation of the leakage detection operation, the one or more string select lines and the one or more ground select lines to a cut-off voltage level by applying the driving voltage to a first plurality of second terminals of the plurality of pass transistors coupled to the one or more string select lines and the one or more ground select lines of the target memory block, wherein the control circuit is further configured to:

set, in the first operation of the leakage detection operation, a plurality of first detection word lines from among the plurality of word lines of the target memory block to a first voltage level by applying the driving voltage to a second plurality of second terminals of the plurality of pass transistors coupled to the plurality of first detection word lines of the target memory block;

set, in the first operation of the leakage detection operation, a plurality of second detection word lines from among the plurality of word lines of the target memory block to a second voltage level by applying the driving voltage to a third plurality of second terminals of the plurality of pass transistors coupled to the plurality of second detection word lines of the target memory block, the second voltage level being lower than the first voltage level;

apply, in the first operation of the leakage detection operation, a first block selection voltage to a plurality of first terminals of the plurality of pass transistors coupled to the target memory block, the first block selection voltage having a third voltage level;

apply, in a second operation of the leakage detection operation, a second block selection voltage to the plurality of first terminals of the plurality of pass transistors coupled to the target memory block, the second block selection voltage having the cut-off voltage level; and apply, in a third operation of the leakage detection operation, a third block selection voltage, to the plurality of first terminals of the plurality of pass transistors coupled to the target memory block, the third block selection voltage having a fourth voltage level, the fourth voltage level being lower than the third voltage level.

12. The memory device of claim 11, wherein the control circuit is further configured to:

enter a fourth operation of the leakage detection operation based on leakage not being detected in a first direction in the target memory block, when the third operation of the leakage detection operation is performed;

apply, in the fourth operation of the leakage detection operation, the first block selection voltage to the plurality of first terminals of the plurality of pass transistors coupled to the target memory block; and set, in the fourth operation of the leakage detection operation, the one or more string select lines and the one or more ground select lines to a fifth voltage level by applying the driving voltage to the first plurality of second terminals of the plurality of pass transistors coupled to the one or more string select lines and the one or more ground select lines of the target memory block.

13. The memory device of claim 12, wherein the control circuit is further configured to:

apply, in a fifth operation of the leakage detection operation, the second block selection voltage to the plurality of first terminals of the plurality of pass transistors coupled to the target memory block; and apply, in a sixth operation of the leakage detection operation, a fourth block selection voltage to the first terminals of the plurality of pass transistors coupled to the target memory block, the fourth block selection voltage having a sixth voltage level, the sixth voltage level being lower than the fourth voltage level.

14. A memory device comprising:

a memory cell array comprising a plurality of memory blocks, the plurality of memory blocks comprising a plurality of word lines, one or more string select lines, and one or more ground select lines;

a pass transistor circuit comprising a plurality of pass transistors coupled to the plurality of memory blocks through the plurality of word lines, the one or more string select lines, and the one or more ground select lines;

a row decoder configured to provide a block selection voltage to first terminals of the plurality of pass transistors and provide a driving voltage to second terminals of the plurality of pass transistors;

a voltage generator configured to generate the block selection voltage and the driving voltage; and a control circuit configured to control the row decoder and the voltage generator and perform a leakage detection operation on the plurality of memory blocks, wherein the control circuit is further configured, when the leakage detection operation is performed on a target memory block from among the plurality of memory blocks, to:

set a plurality of first detection word lines from among the plurality of word lines of the target memory block to a first voltage level by applying the driving voltage to a first plurality of second terminals of the plurality of pass transistors coupled to the plurality of first detection word lines of the target memory block;

set a plurality of second detection word lines from among the plurality of word lines of the target memory block to a second voltage level by applying the driving voltage to a second plurality of second terminals of the plurality of pass transistors coupled to the plurality of second detection word lines of the target memory block, the second voltage level being lower than the first voltage level; and set the one or more string select lines and the one or more ground select lines to a third voltage level by applying the driving voltage to a third plurality of second terminals of the plurality of pass transistors coupled to the one or more string select lines and the one or more ground select lines of the target memory block, and wherein the control circuit is further configured to:

set, in a first operation of the leakage detection operation, the plurality of word lines, the one or more string select lines, and the one or more ground select lines comprised by the target memory block by applying a first block selection voltage to a plurality of first terminals of the plurality of pass transistors coupled to the target memory block, the first block selection voltage having a fourth voltage level;

apply, in a second operation of the leakage detection operation, a second block selection voltage to the plurality of first terminals of the plurality of pass transistors coupled to the target memory block, the second block selection voltage having a cut-off voltage level; and apply, in a third operation of the leakage detection operation, a third block selection voltage to the plurality of first terminals of the plurality of pass transistors coupled to the target memory block, the third block selection voltage having a fifth voltage level, the fifth voltage level being lower than the fourth voltage level.

15. The memory device of claim 14, wherein the control circuit is further configured to:

terminate the leakage detection operation based on leakage being detected in at least one of a first direction and a second direction in the target memory block, when the third operation of the leakage detection operation is performed.

16. The memory device of claim 14, wherein the control circuit is further configured to:

re-enter the first operation of the leakage detection operation based on leakage not being detected in at least one of a first direction and a second direction in the target memory block, when the third operation of the leakage detection operation is performed;

set, in the re-entered first operation of the leakage detection operation, the plurality of first detection word lines to the second voltage level by applying the driving voltage to the second plurality of second terminals of the plurality of pass transistors coupled to the plurality of first detection word lines; and set, in the re-entered first operation of the leakage detection operation, the plurality of second detection word lines to the first voltage level by applying the driving voltage to the third plurality of second terminals of the plurality of pass transistors coupled to the plurality of second detection word lines.

17. The memory device of claim 14, wherein:

the plurality of memory blocks further comprises one or more dummy word lines, the plurality of pass transistors is coupled to the one or more dummy word lines, and the control circuit is further configured to set, when the leakage detection operation is performed on the target memory block, the one or more dummy word lines to the third voltage level by applying the driving voltage to a fourth plurality of second terminals of the plurality of pass transistors coupled to the one or more dummy word lines of the target memory block, so as to set.

* * * * *